United States Patent
Leobandung

(10) Patent No.: US 10,347,657 B1
(45) Date of Patent: Jul. 9, 2019

(54) SEMICONDUCTOR CIRCUIT INCLUDING NANOSHEETS AND FINS ON THE SAME WAFER

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/868,683

(22) Filed: Jan. 11, 2018

(51) Int. Cl.
*H01L 27/12* (2006.01)
*H01L 21/84* (2006.01)
*H01L 29/06* (2006.01)
*H01L 29/78* (2006.01)

(52) U.S. Cl.
CPC ........ *H01L 27/1207* (2013.01); *H01L 21/845* (2013.01); *H01L 29/0653* (2013.01); *H01L 29/0673* (2013.01); *H01L 29/7853* (2013.01)

(58) Field of Classification Search
CPC .............. H01L 27/1207; H01L 21/845; H01L 29/0653; H01L 29/0673; H01L 29/7853
See application file for complete search history.

(56) References Cited

U.S. PATENT DOCUMENTS

| | | | |
|---|---|---|---|
| 8,994,081 B2 | 3/2015 | Leobandung | |
| 9,362,177 B1 | 6/2016 | Haensch | |
| 9,653,464 B1 | 5/2017 | Leobandung | |
| 9,660,028 B1 | 5/2017 | Cheng | |
| 9,741,822 B1 | 8/2017 | Jagannathan | |
| 2008/0206934 A1* | 8/2008 | Jones | H01L 21/84 438/151 |
| 2015/0255300 A1* | 9/2015 | He | H01L 21/3088 257/401 |
| 2016/0172358 A1* | 6/2016 | Hatcher | H01L 29/42392 257/401 |
| 2017/0133459 A1 | 5/2017 | Pranatharthiharan et al. | |
| 2017/0179128 A1 | 6/2017 | Balakrishnan | |
| 2017/0179244 A1 | 6/2017 | Radens | |
| 2018/0033871 A1* | 2/2018 | Xie | H01L 29/66795 |

OTHER PUBLICATIONS

Authors et al: Disclosed Anonymously; "Side-Anchoring Silicon-on-Nothing"; An IP.com Prior Art Database Technical Disclosure; IP.com No. IPCOM000250006D; IP.com Electronic Publication Date: May 15, 2017; 6 pages.

Authors, et al.: Disclosed Anonymously, "Long Channel Nanosheet FET on Vertical FET Short Channel Device", An IP.com Prior Art Database Technical Disclosure, IP.Com, IP.com No. IPCOM000250223D; IP.com Electronic Publication Date: Jun. 12, 2017, 5 pages.

* cited by examiner

*Primary Examiner* — Sitaramarao S Yechuri
(74) *Attorney, Agent, or Firm* — Cantor Colburn LLP; Vazken Alexanian

(57) ABSTRACT

A complimentary metal-oxide-semiconductor (CMOS) device includes a wafer having a bulk semiconductor layer. A fin-type semiconductor device is formed on a first portion of the wafer. The CMOS devices also includes a nanosheet semiconductor device formed on a second portion of the wafer different from the first portion.

19 Claims, 24 Drawing Sheets

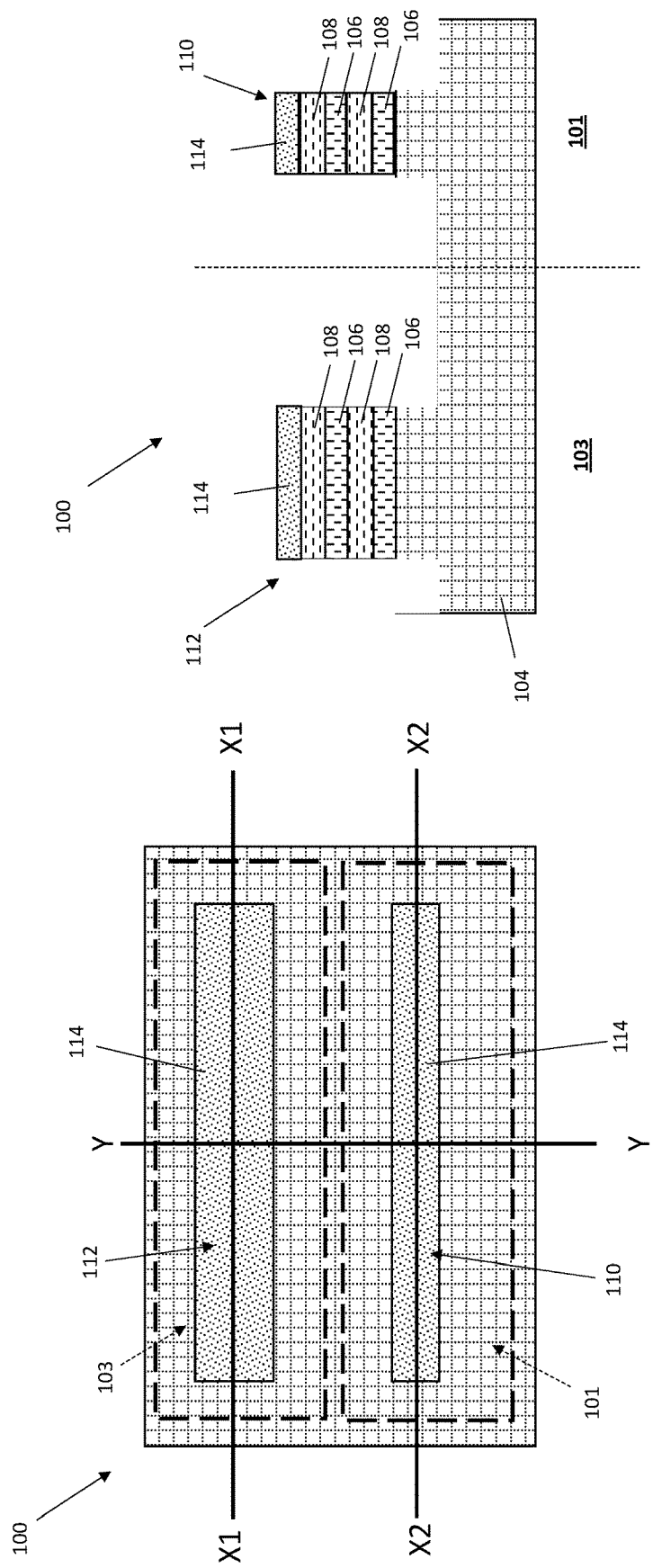

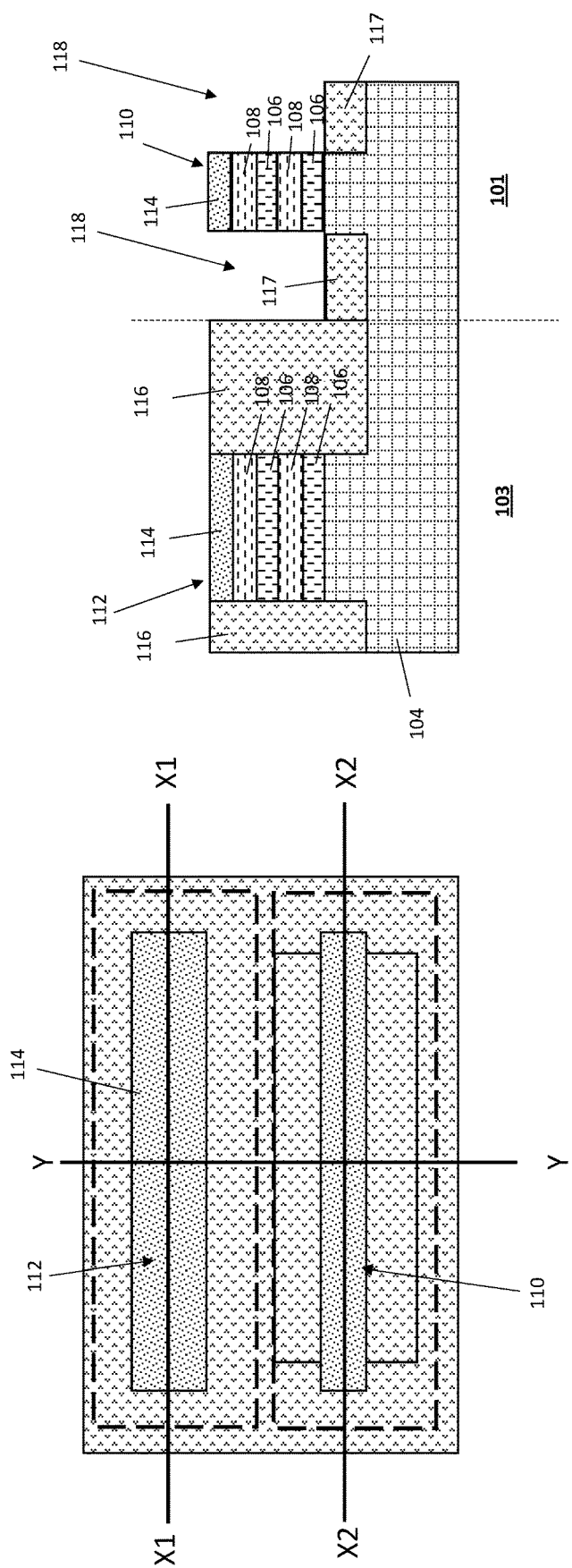

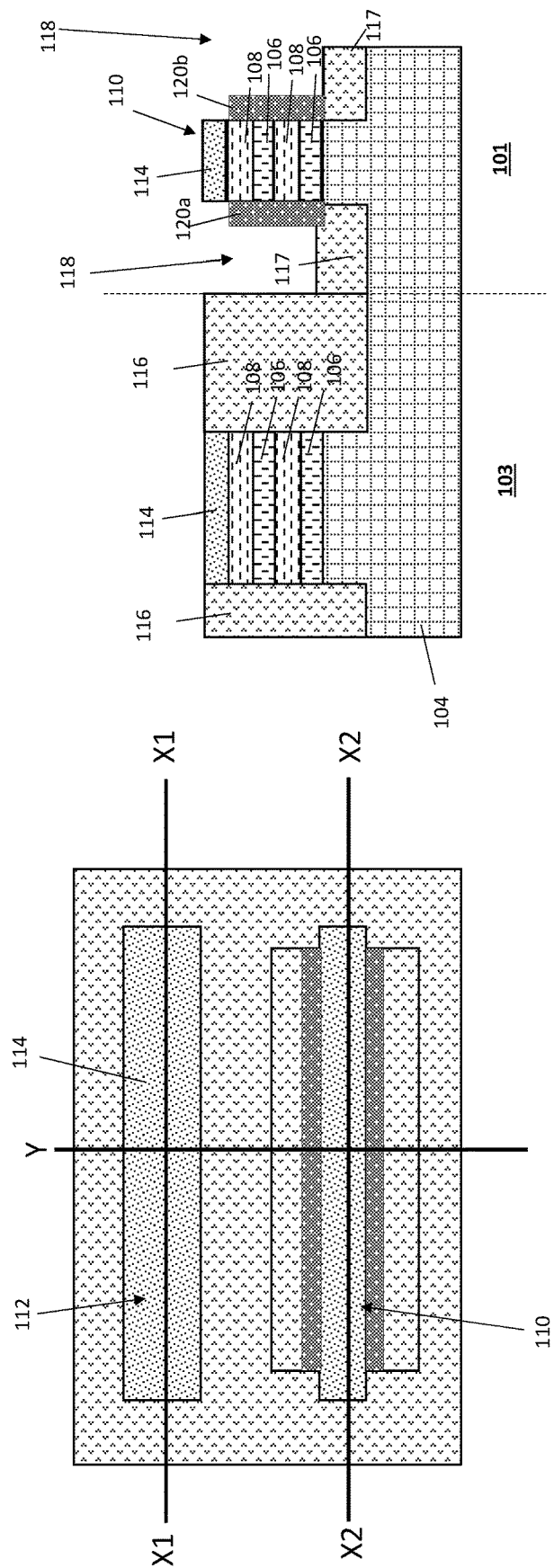

PFET

NFET

PFET

NFET

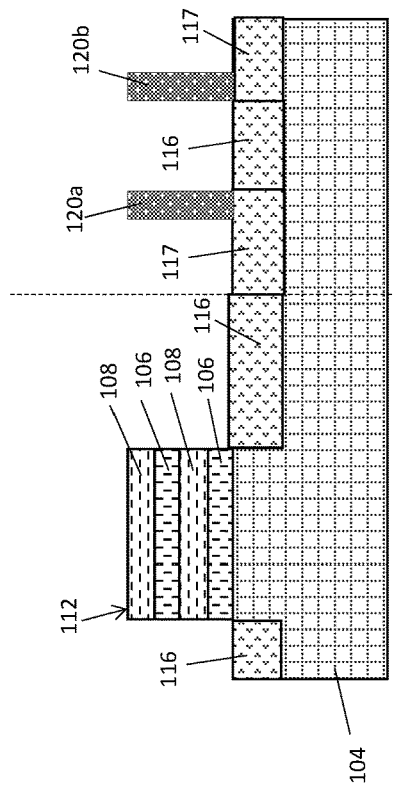
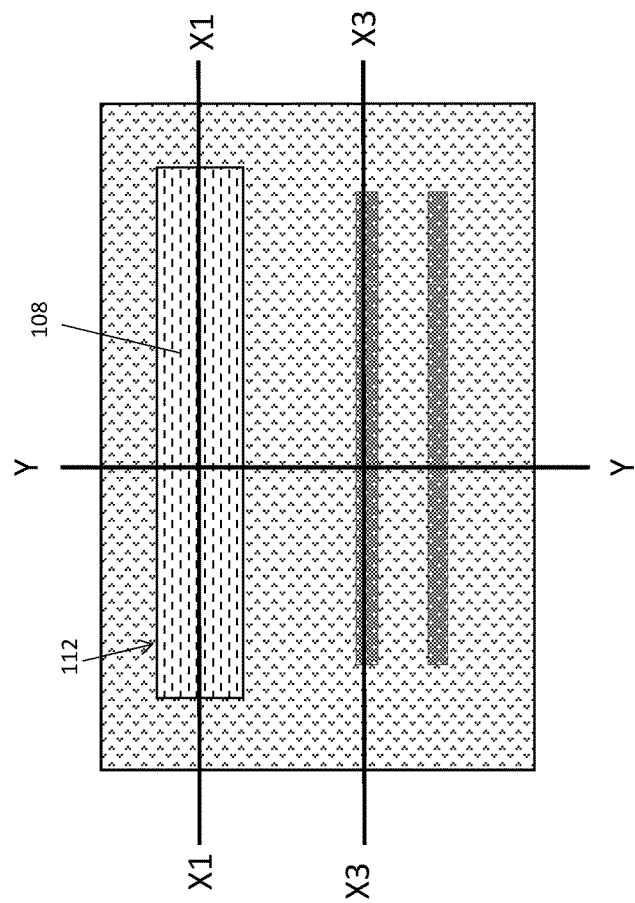
FIG. 8B
FIG. 8A

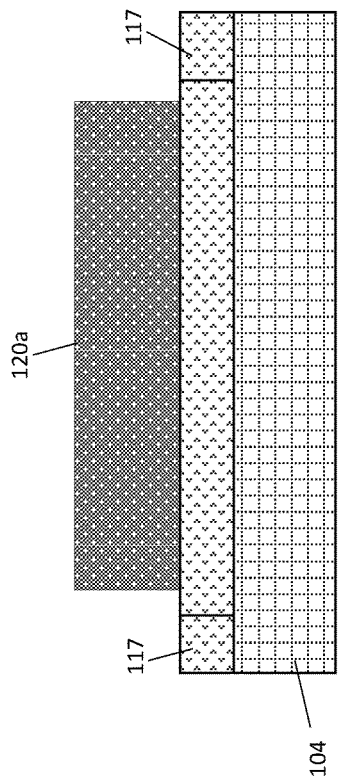
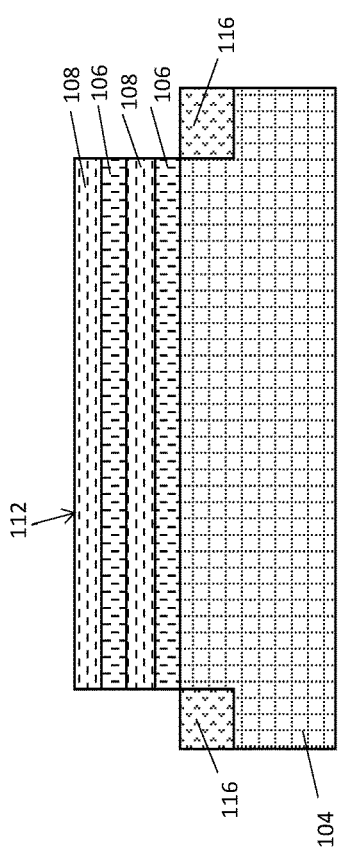
FIG. 8D PFET
FIG. 8C NFET

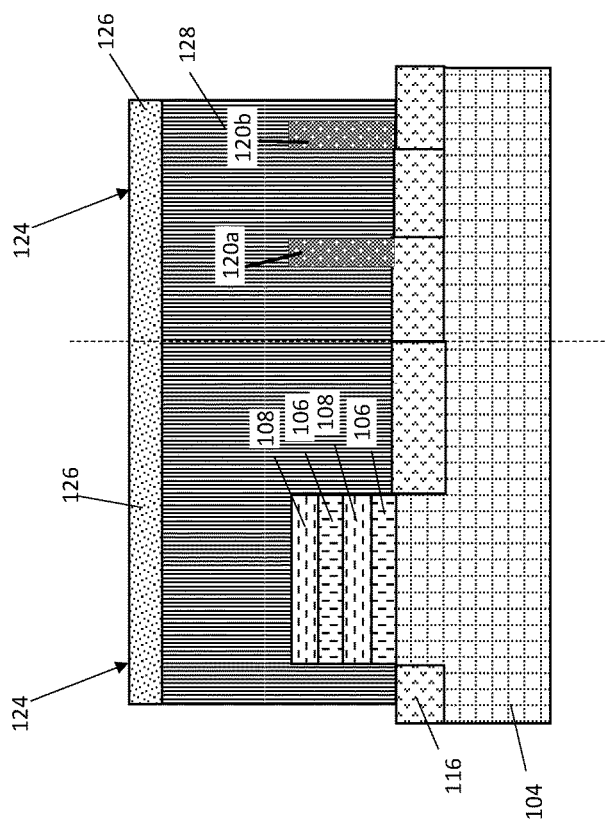
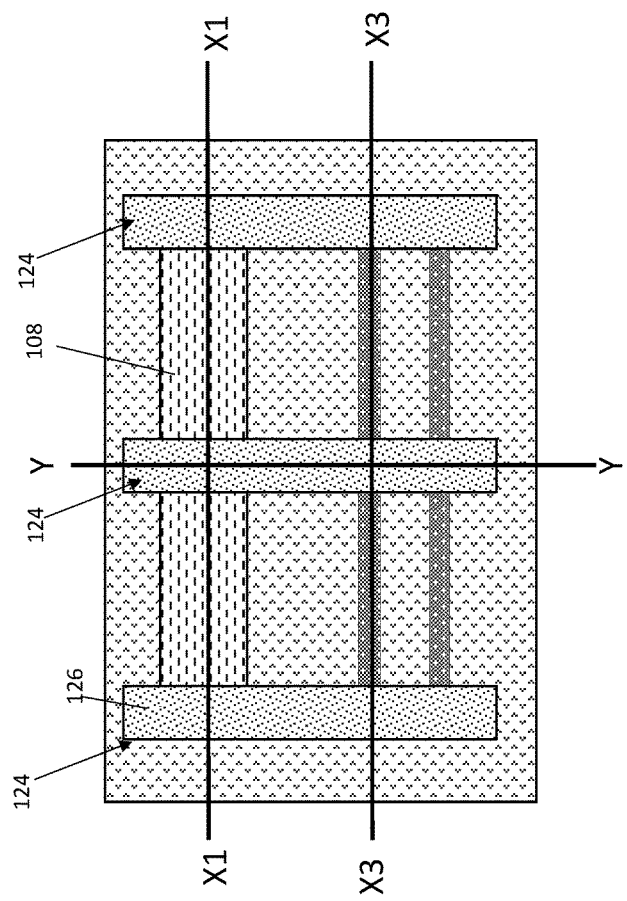
FIG. 9B
FIG. 9A

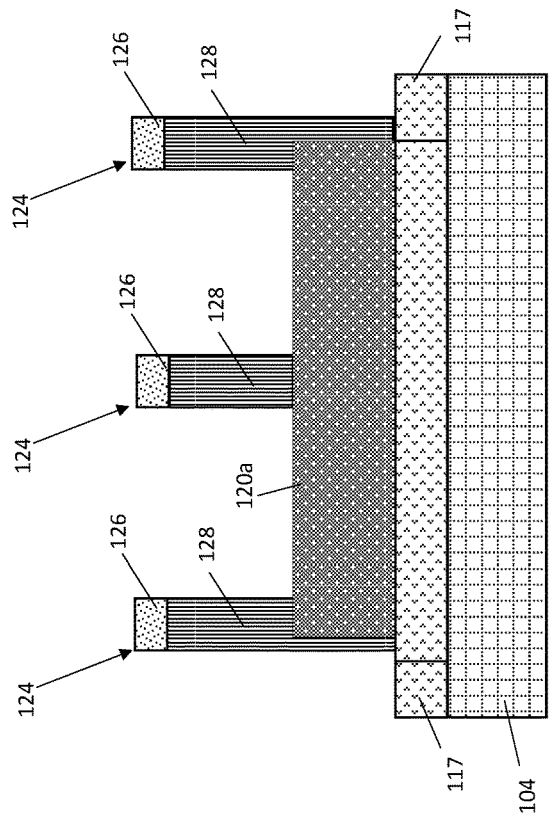
FIG. 9D PFET
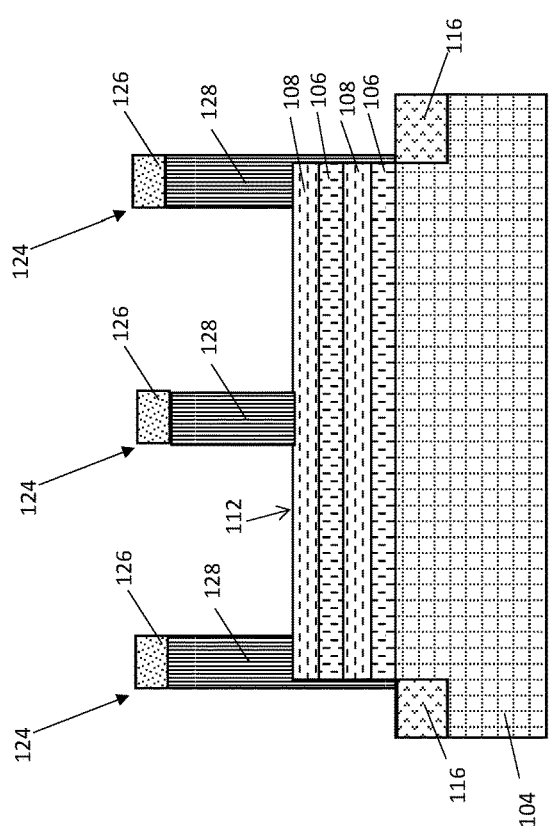
FIG. 9C NFET

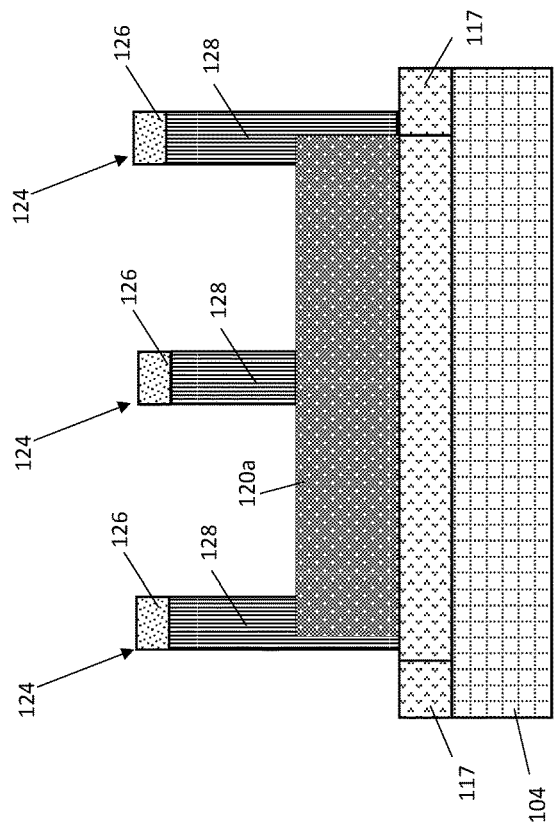
FIG. 10D PFET
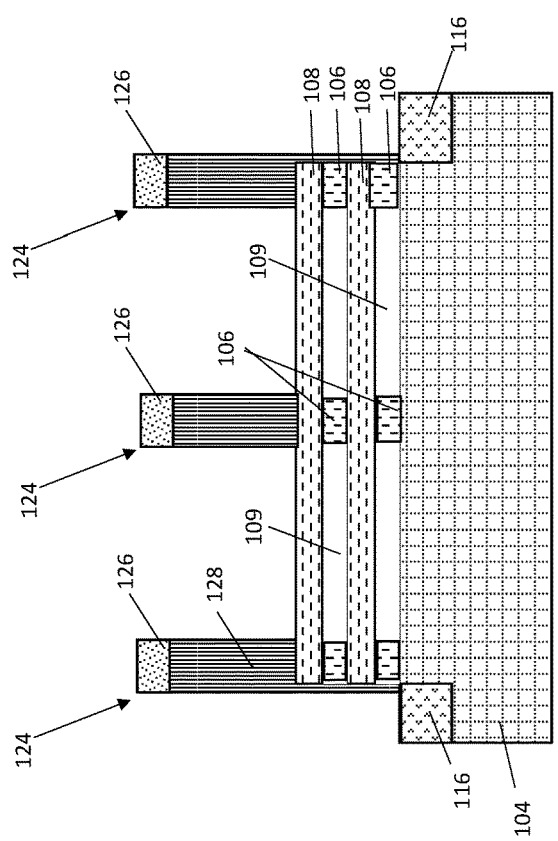
FIG. 10C NFET

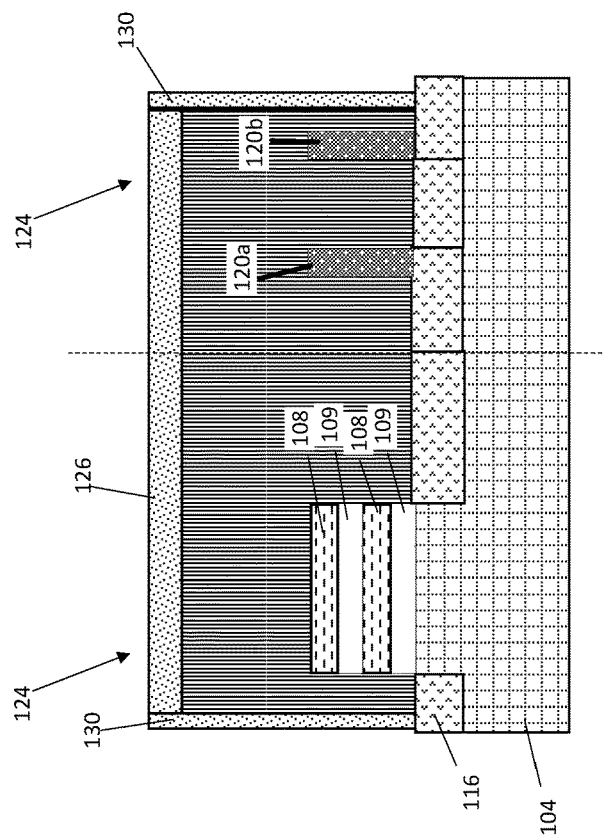
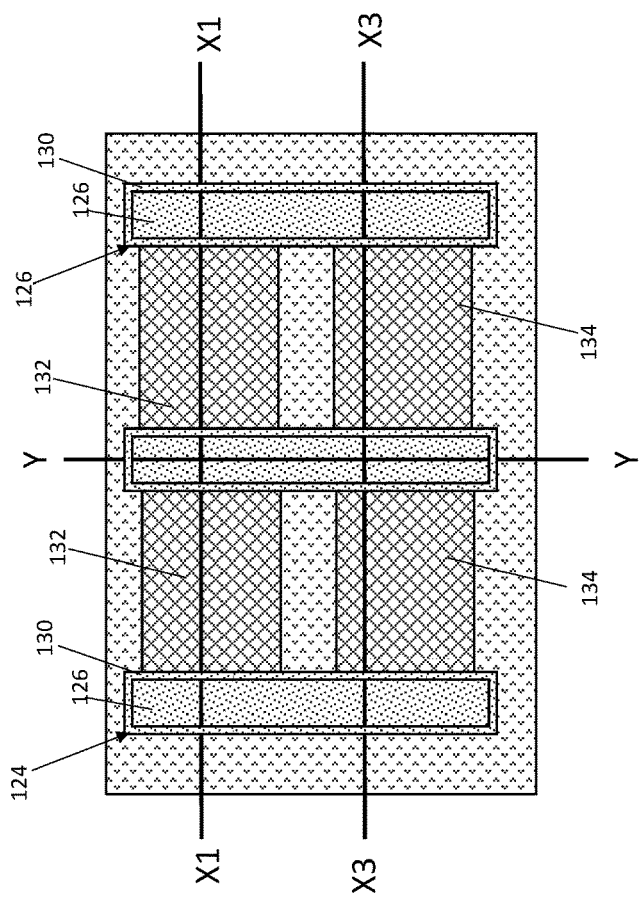
FIG. 11B
FIG. 11A

PFET

NFET

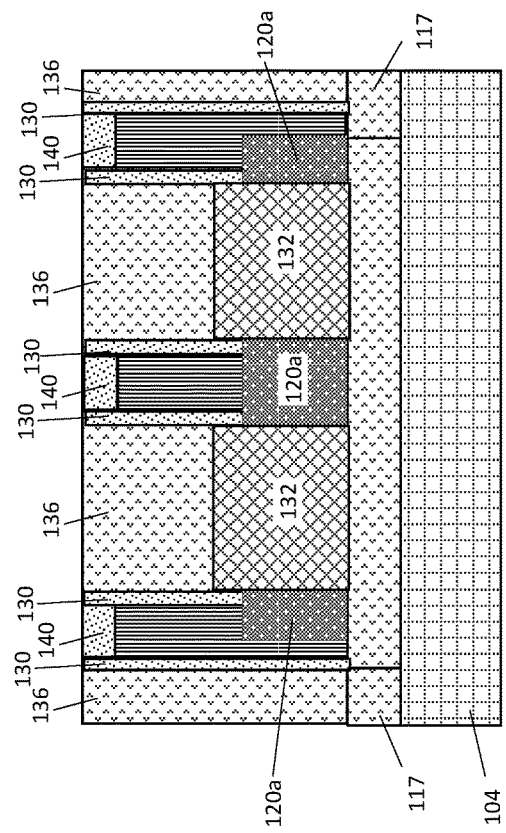
FIG. 12D PFET
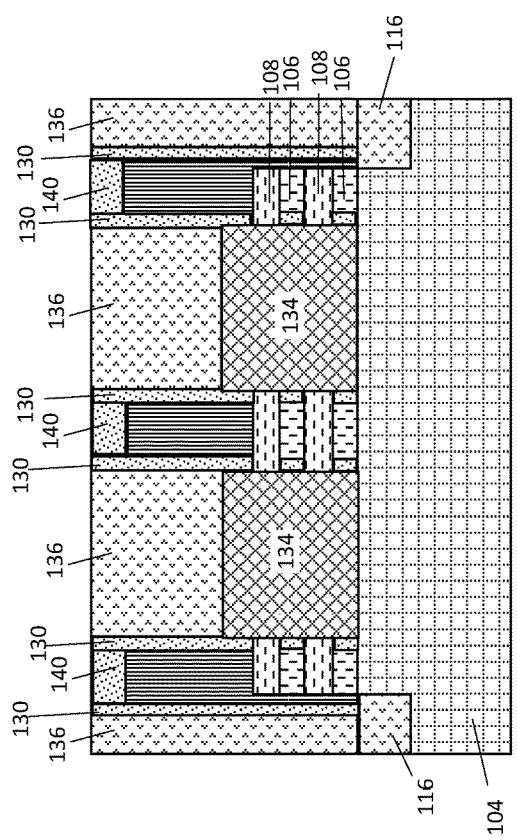
FIG. 12C NFET

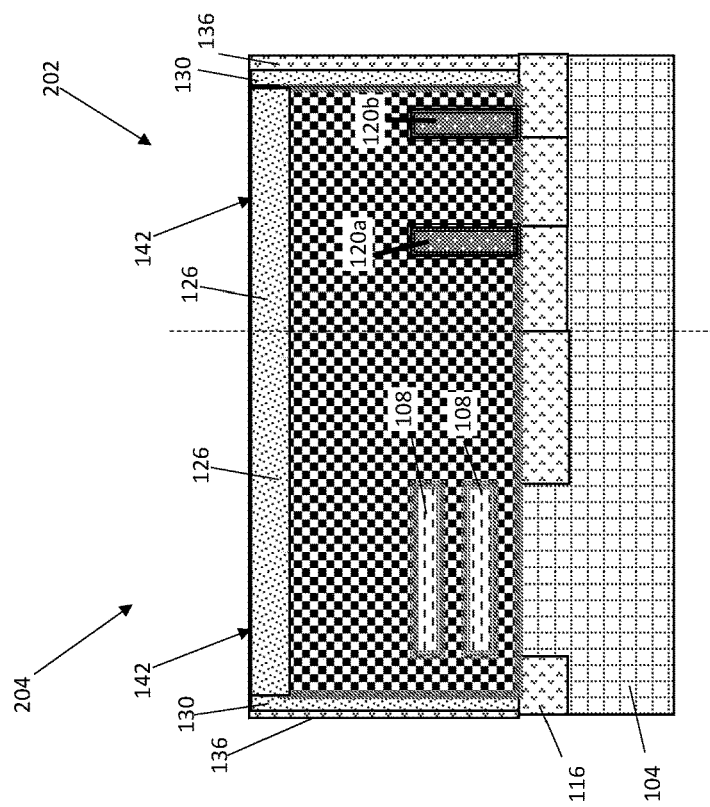
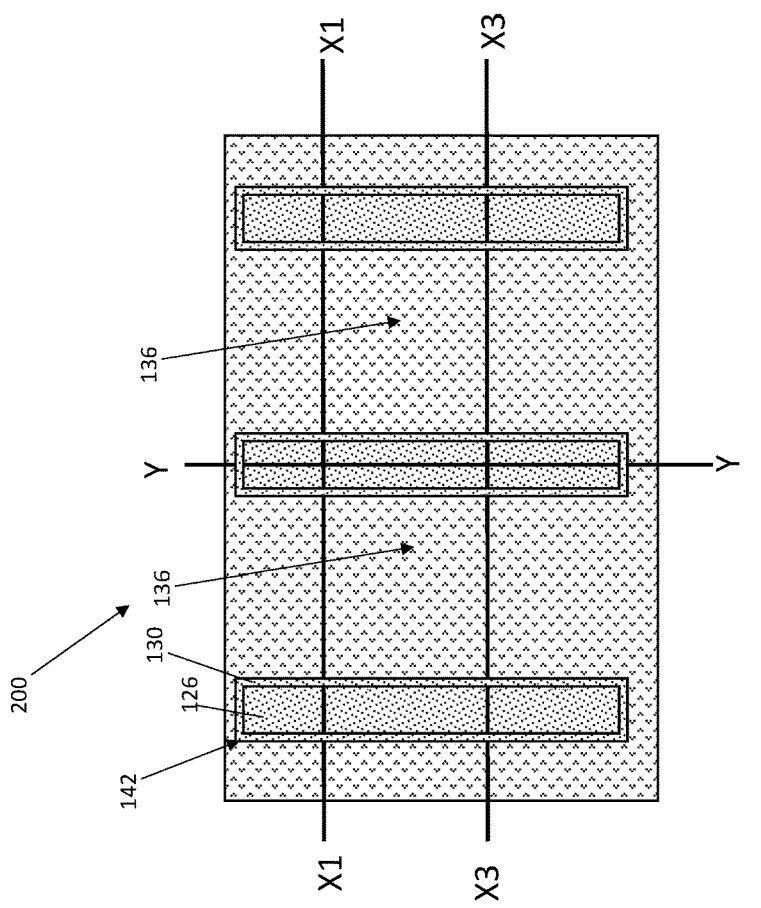
FIG. 13B
FIG. 13A

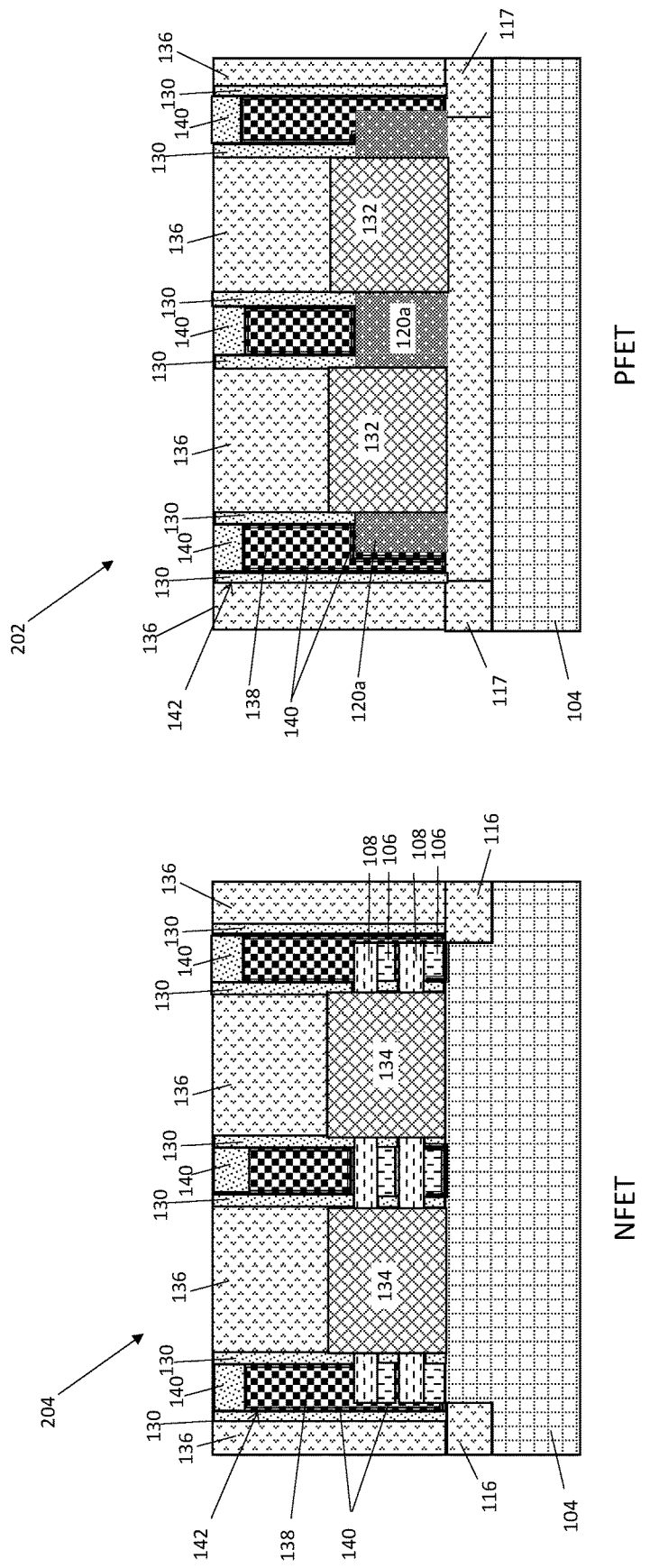
FIG. 13D PFET
FIG. 13C NFET

PFET

NFET

US 10,347,657 B1

SEMICONDUCTOR CIRCUIT INCLUDING NANOSHEETS AND FINS ON THE SAME WAFER

BACKGROUND

The present invention generally relates to semiconductor devices, and more specifically, to fabrication methods and resulting semiconductor-based circuitry that includes nanosheets and fins formed on the same wafer.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

SUMMARY

Embodiments of the present invention are directed to a semiconductor device. A non-limiting example of the semiconductor device includes a complimentary metal-oxide-semiconductor (CMOS) device. The CMOS device includes a wafer having a bulk semiconductor layer. A fin-type semiconductor device is formed on a first portion of the wafer. The CMOS devices also includes a nanosheet semiconductor device formed on a second portion of the wafer different from the first portion.

Embodiments of the present invention are directed to a method of fabricating a semiconductor device. A non-limiting example of the method includes forming a first sacrificial semiconductor stack on a semiconductor wafer and a second semiconductor stack on the semiconductor wafer. The method further includes epitaxially growing a semiconductor material from the first sacrificial semiconductor stack and subsequently removing the first sacrificial semiconductor stack to form a semiconductor fin. The method further includes selectively removing sacrificial layers from the second sacrificial stack while maintaining active semiconductor layers of the second sacrificial stack to form a semiconductor nanosheet. The method further includes forming a first gate structure on the semiconductor fin to define a fin-type device on the semiconductor wafer, and forming a second gate structure on the semiconductor nanosheet to define a nanosheet device on the semiconductor wafer.

Embodiments of the present invention are directed to an additional method of fabricating a complimentary metal-oxide-semiconductor (CMOS) device. The method includes forming, on an upper surface of a bulk semiconductor layer of a semiconductor wafer, an alternating series of first semiconductor layers and second semiconductor layers stacked on top of one another, a lower-most first semiconductor layer formed directly on the bulk semiconductor layer and having a different doping concentration of than remaining first semiconductor layers. The method further includes etching the alternating series of first semiconductor layers and second semiconductor layers to form a first sacrificial stack on the semiconductor wafer and a second sacrificial stack on the semiconductor wafer. The method further includes selectively etching the remaining first semiconductor layers with respect to the second semiconductor layers and the lower-most first semiconductor layers layer to form a plurality of semiconductor nanosheets. The method further includes epitaxially growing a semiconductor material from the first sacrificial semiconductor stack and subsequently removing the first sacrificial semiconductor stack to form a semiconductor fin. The method further includes replacing the lower-most first semiconductor layers layer with a dielectric layer. The method further includes forming a first electrically conductive gate structure on the semiconductor fin to define a p-type field effect field transistor (PFET) on the semiconductor wafer, and forming a second electrically conductive gate structure on the plurality of semiconductor nanosheets to form an n-type filed effect transistor (NFET) on the semiconductor wafer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a top view of the wafer following formation of first and second sacrificial stacks;

FIG. 2B is a cross-sectional view of the wafer taken along line Y-Y;

FIG. 3A is a top view of the wafer following formation of shallow trench isolation (STI) regions in the PFET region;

FIG. 3B is a cross-sectional view of the wafer taken along line Y-Y;

FIG. 4A is a top view of the wafer after forming a semiconductor material on sidewalls of the first sacrificial stack;

FIG. 4B is a cross-sectional view of the wafer taken along line Y-Y;

FIG. 8A is a top view of the wafer after partially recessing the dielectric material;

FIG. 8B is a cross-sectional view of the wafer taken along line Y-Y;

FIG. 8C is a cross-sectional view of the wafer taken along line X1-X1;

FIG. 8D is a cross-sectional view of the wafer taken along line X3-X3;

FIG. 9A is a top view of the wafer following formation of a plurality of gate stacks;

FIG. 9B is a cross-sectional view of the wafer taken along line Y-Y;

FIG. 9C is a cross-sectional view of the wafer taken along line X1-X1;

FIG. 9D is a cross-sectional view of the wafer taken along line X3-X3;

FIG. 10C is a cross-sectional view of the wafer taken along line X1-X1;

FIG. 10D is a cross-sectional view of the wafer taken along line X3-X3;

FIG. 11A is a top view of the wafer following formation of source/drain regions;

FIG. 11B is a cross-sectional view of the wafer taken along the line Y-Y;

FIG. 12C is a cross-sectional view of the wafer taken along the line X1-X1;

FIG. 12D is a cross-sectional view of the wafer taken along the line X3-X3;

FIG. 13A is a top view of the wafer following a replacement metal gate (RMG) process;

FIG. 13B is a cross-sectional view of wafer taken along the line Y-Y;

FIG. 13C is a cross sectional view of the wafer taken along the line X1-X1;

FIG. 13D is a cross-sectional view of the wafer taken along line X3-X3;

Figure 1A:
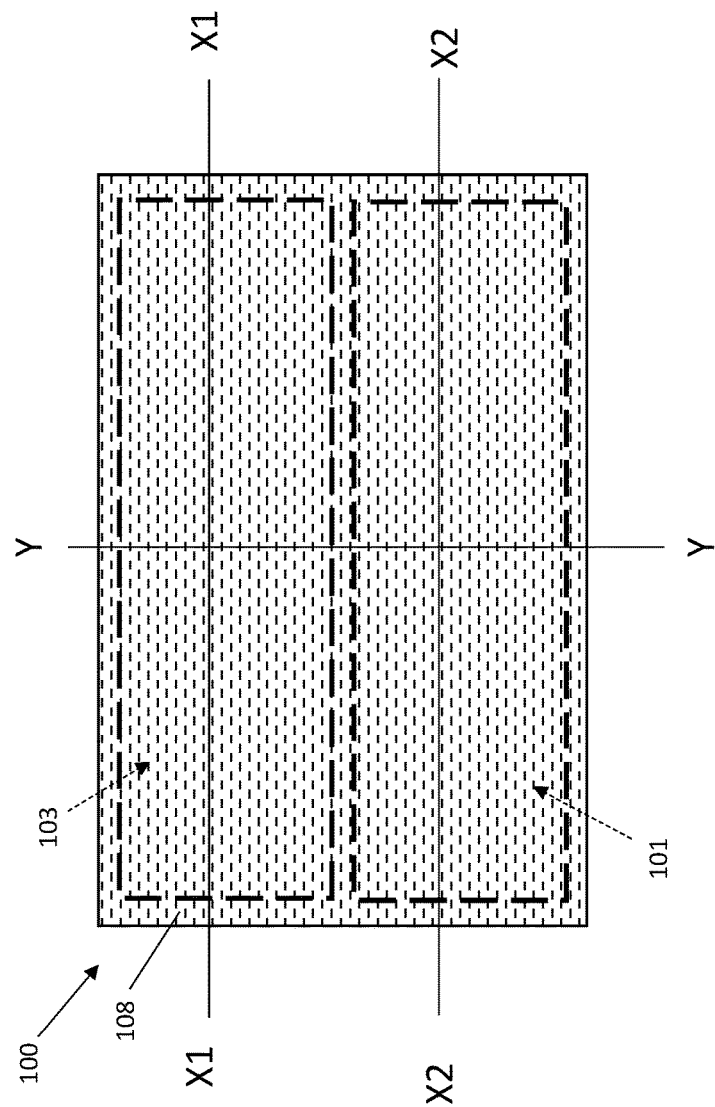
FIG. 1A depicts a top view of a starting semiconductor wafer including a designated NFET region and a designated PFET region.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, electrons realize optimal mobility in a <100>-orientated channel region (e.g., a horizontal channel orientation) in a semiconductor material, e.g., silicon (Si), while electron holes (typically referred to simply as holes) realize optimal mobility in a <110>-orientated channel region (e.g., a vertical channel orientation) in a semiconductor material, e.g., silicon (Si). NFET devices operate based on electron mobility, while PFET devices operate based on hole mobility.

Nanosheet devices include a channel region of one or more nanosheets where the active semiconductor material forming the channel region is greater along the horizontal direction than the vertical direction (i.e., the channel length is typically greater than the channel height). Fin-type devices, however, include a channel region formed as a fin structure where the active semiconductor material forming the channel region is greater along the vertical direction than the horizontal direction (i.e., the height of the fin is typically greater than the length of the fin). Conventional CMOS devices, however, typically provide a semiconductor wafer that supports a single semiconductor topology, i.e., which only supports fin-type semiconductor devices or only nanosheets semiconductor devices.

Turning now to an overview of the aspects of the invention, one or more embodiments of the invention address the above-described shortcomings of the prior art by providing a semiconductor fabrication process flow that forms both a nanosheet semiconductor device and a fin-type semiconductor device on a common wafer to optimize electron mobility and hole mobility with respect to the orientation of the individual semiconductor device's channel region. Therefore, above-described aspects of the invention address the shortcomings of the prior art by forming a N-type nanosheet FET and a P-type finFET on a common wafer, thereby optimizing the electron and hole mobility to improve the performance of the semiconductor device.

Figure 1B:
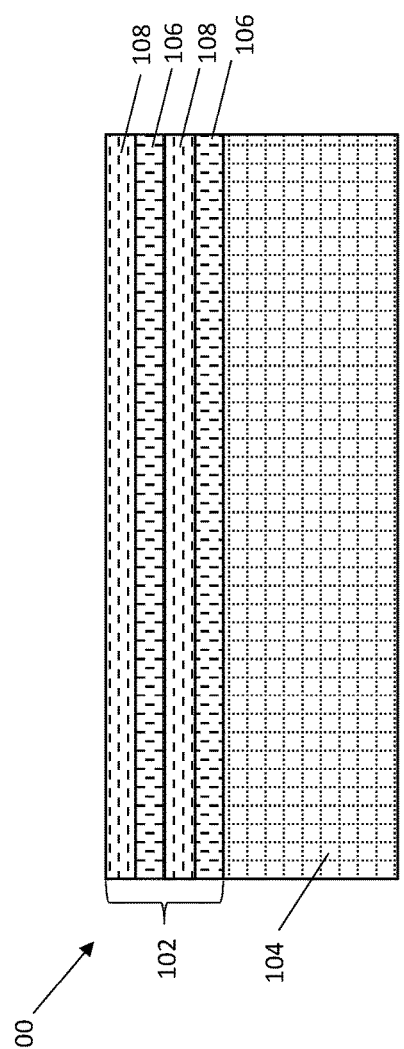
FIG. 1B is a cross-sectional view of the starting wafer taken along line Y-Y.

Turning now to a more detailed description of aspects of the present invention, FIG. 1A depicts a top view of a starting wafer 100 having a designated PFET region 101 and a designated NFET region 103. The wafer 100 includes a stack of individual semiconductor layers 102 formed on a bulk layer 104. The bulk layer 104 can be composed of various semiconductor materials including, but not limited to, silicon (Si). The wafer 100 extends along a first axis (e.g., the X-axis) to define a length and a second axis (e.g., the Y-axis) perpendicular the first axis to define a width. FIG. 1B is a cross-section illustration of the wafer 100 taken along line Y-Y, which shows the wafer 100 extending along a third axis (e.g., the Z-axis) perpendicular to the first and second axes to define a height (e.g., vertical thickness).

The stack of semiconductor layers 102 includes an alternating series of sacrificial layers 106 and active semiconductor layers 108 formed on the bulk layer 104. A first sacrificial layer 106 is formed directly on an upper surface of the bulk layer 104, and a first active semiconductor layer 108 is formed on an upper surface of the first sacrificial layer 106. Each sacrificial layer 106 has a vertical thickness ranging, for example, from approximately 3 nm to approximately 20 nm. Similarly, each active semiconductor layer 108 has a vertical thickness ranging, for example, from approximately 3 nm to approximately 20 nm.

The sacrificial layers 106 are formed of a first semiconductor material and the active semiconductor layers 108 are formed of a second semiconductor material different from the first semiconductor material. For example, the sacrificial layers 106 are formed from silicon germanium (SiGe), while the active semiconductor layers 108 are formed from silicon (Si). Other variations of semiconductor materials can also be used which allow the sacrificial layers 106 to be etched while preserving the active semiconductor layers 108 so that they are released from the stack to form the intended channels of the semiconductor device.

Multiple epitaxial growth processes can be performed to form the sacrificial layers 106 and the active semiconductor layers 108. To achieve a sacrificial layer 106 directly on the upper surface of the bulk layer 104 for example, an initial layer of SiGe 106, for example, is first epitaxially grown on the upper surface of bulk layer 104. Subsequent to forming the initial sacrificial layer 106 (e.g., SiGe layer), an active semiconductor 108 (e.g., a layer of Si) is epitaxially grown on the upper surface of the initial SiGe layer 106. Thereafter, additional epitaxial growth processes can be performed to form an alternating series of SiGe layers 106 and Si layers 108 that define the stack of semiconductor layers 102 as further illustrated in FIG. 1.

It should be appreciated that the alternating series of sacrificial layers 106 and active semiconductor layers 108 can be either relaxed or strained. For example, if grown to a certain thickness or with a low Ge concentration, the semiconductor layers 106 and 108 will be relaxed due to dislocation defects. However, increasing the concentration of Ge, for example, can induce a strain on the semiconductor layers 106 and 108.

When forming the sacrificial layers 106 from SiGe, some embodiments allow for forming each sacrificial layer 106 with the same percentage of germanium (Ge). In other embodiments, the sacrificial layers 106 can be composed of different percentages of Ge. For example, the first sacrificial layer 106 (i.e., the sacrificial layer 106 formed directly on the bulk layer 104) can be composed a first amount of GE (e.g., 25% Ge), while one or more remaining sacrificial layers 106 are composed of a larger amount of Ge (e.g., 50% Ge). The first sacrificial layer 106 can be formed by epitaxially growing an initial SiGe layer 106 on an upper surface of bulk layer 104. Thereafter, the SiGe layer 106 is condensed using a thermal oxidation process, for example, that results in the Si in the SiGe layer 106 being consumed (by the oxidation process) while the Ge is driven down into the initial bulk layer. The thermal oxidation process includes, for example, exposing the initial SiGe layer 106 to a temperature of from about 900° Celsius (C) to about 1,200° C., e.g., about 1,100° C. for a duration from about 5 minutes to about 15 minutes, in $O_2$. In this manner, a single initial SiGe layer 106 is formed at the upper surface of the bulk layer 104. Subsequent to forming the initial SiGe layer 106, a second SiGe layer 106 having a greater concentration of Ge (e.g., 50%) is formed on the upper surface of the initial sacrificial layer 106. Thereafter, additional epitaxial growth processes can be performed to form the alternating series of active semiconductor layers 108 (e.g., Si layers 108) and sacrificial layers 106 (e.g., SiGe layers having a greater concentration of Ge). In this manner, the first sacrificial layer 106 can be selectively etched with respect to the remaining sacrificial layers 106 when applying an etching chemistry selective to Ge. In other words, the first sacrificial layer 106 can be etched at a slower rate than the remaining sacrificial layers 106 so that it can be replaced with an optional bulk layer insulator layer (not shown in FIG. 1) as described in greater detail below.

Referring to FIG. 2A, the top of the wafer 100 is illustrated after patterning the PFET region 101 and the NFET region 103 to form a first sacrificial stack 110 and a second sacrificial stack 112. The first sacrificial stack 110 and the second sacrificial stack 112 can be formed by first depositing a hardmask layer 114 such as layer of silicon nitride (SiN), for example, on the surface of the upper-most active semiconductor layer 108. A photoresist layer (not shown) can be deposited on the upper surface of the hardmask layer 114 then patterned using a photolithography process to define desired patterns into the photoresist layer. A directional etching process such as a reactive ion etch (ME) process is performed to transfer the pattern through the stack of semiconductor layers 102 and into the bulk layer 104 to form the first sacrificial stack 110 and the second sacrificial stack 112.

FIG. 2B is a cross-sectional view of the wafer 100 taken along the line Y-Y following formation of the first sacrificial stack 110 and the second sacrificial stack 112. The horizontal width (e.g., extending along the X-axis) of the first sacrificial stack 110 is less than the horizontal width of the second sacrificial stack 112. The first nanosheet stack 110 can also have a vertical height (e.g., extending along the Z-axis) that is greater than its horizontal width (e.g., extending along the Y-axis). The second sacrificial stack 112, however, can have a horizontal width (e.g., extending along the Y-axis) that is greater than or substantial the same as, its vertical height (e.g., extending along the Z-axis).

Turning to FIG. 3A, the top of the wafer 100 is illustrated following deposition of an oxide material 116 to cover the first sacrificial stack 110 and the second sacrificial stack 112. The oxide material 116 can be composed of silicon dioxide (SiO2), for example, and can be deposited using various deposition techniques such as, for example, a chemical vapor deposition (CVD) process.

Figure 3D:
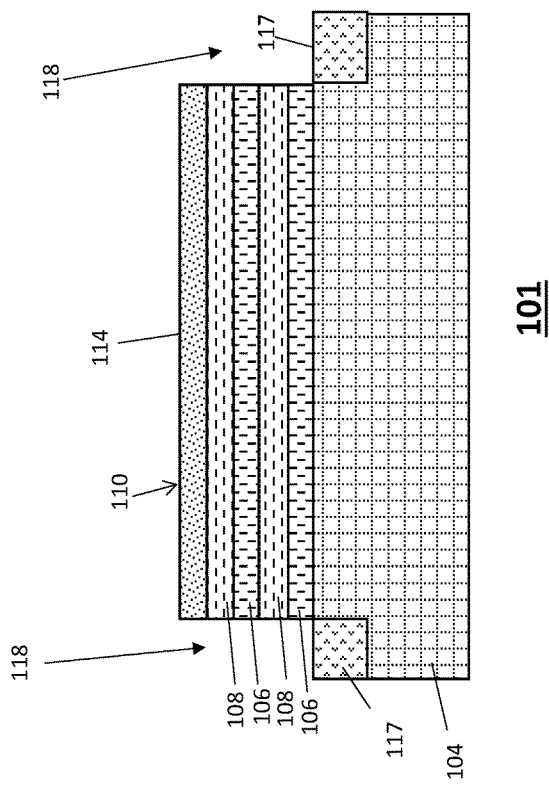
FIG. 3D is a cross-sectional view of the wafer taken along line X2-X2.
Figure 3C:
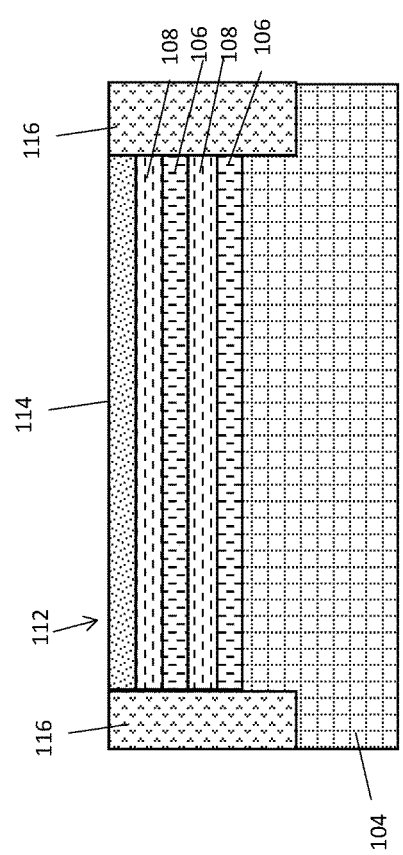
FIG. 3C is a cross-sectional view of the wafer taken along line X1-X1.

After initially depositing the oxide material 116, a mask (not shown) can be deposited on the upper surface of the oxide material 116, and patterned to expose a portion of the underlying oxide material 116 located in the PFET region 101. The exposed oxide material 116 can then be partially recessed to form shallow trenches 118 on opposing sides of the first sacrificial stack 110, while the oxide material is preserved in the PFET region 103 as illustrated in FIGS. 3B, 3C and 3D. The oxide material remaining in the trench 118 serves as a shallow isolation trench (STI) region 117 which can electrically isolate the final PFET device (not shown in FIG. 3B) from the final NFET device (not shown in FIG. 3B).

Referring to FIGS. 4A and 4B, the top of the wafer 100 is illustrated after forming a pair of semiconductor fins 120a and 120b on the exposed sidewalls of the first sacrificial stack 110. The semiconductor fins 120a and 120b are formed according an epitaxy process which facilitates the growth of an electrically conductive material from the exposed sidewalls of the SiGe layers 106 and Si layers 108. The material of the fins 120a and 120b can include, but are not limited to, Si, germanium (Ge), or various III-V materials. The epitaxy process used to grow the fins 120a and 120b can be carried out using various epitaxy techniques including, but not limited to, vapor phase epitaxy (VPE), molecular beam epitaxy (MBE) or liquid phase epitaxy (LPE) with a gaseous or liquid precursor, such as, for example, silicon tetrachloride. The fins 120a and 120b can also be in-situ doped during the growth process. The fins 120a and 120b can have a width (i.e., extending along the Y-axis) ranging, for example, from about 4 nanometers (nm) to about 20 nm, and a height (i.e., extending along the Z-axis) ranging, for example, from about 20 nm to about 50 nm.

Figure 5B:
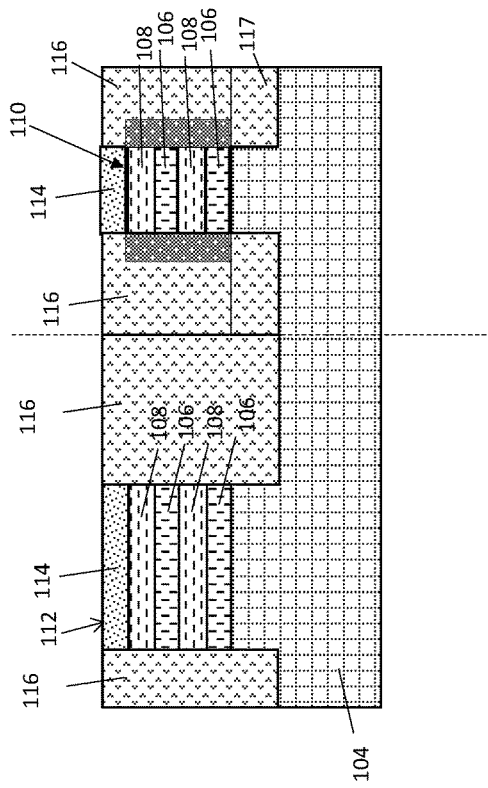
FIG. 5B is a cross-sectional view of the wafer taken along line Y-Y.
Figure 5A:
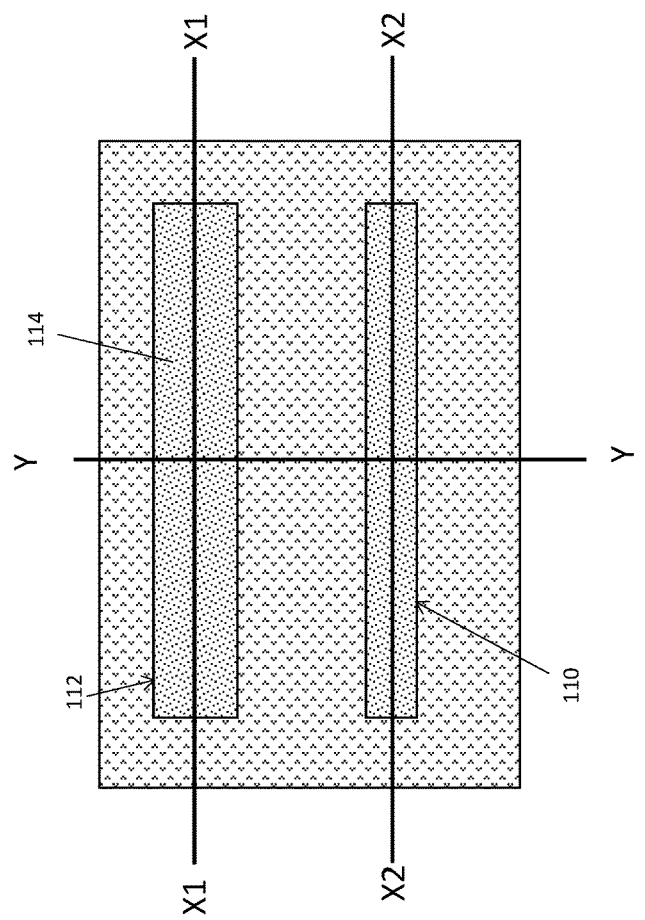
FIG. 5A is a top view of the wafer following deposition of a dielectric layer that covers the first and second sacrificial stacks.
Figure 5D:
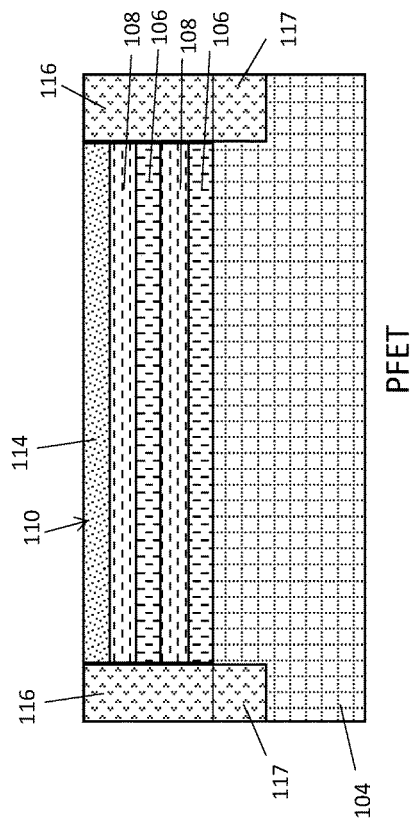
FIG. 5D is a cross-sectional view of the wafer taken along X2-X2.
Figure 5C:
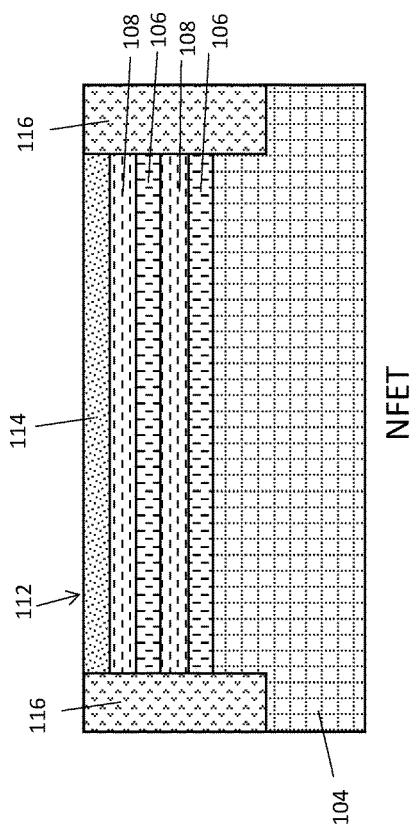
FIG. 5C is a cross-sectional view of the wafer taken along X1-X1.

Turning to FIG. 5A, the top view of the wafer 100 is illustrated following an oxide deposition process that refills the shallow trenches 118 with an oxide material 116. The oxide material 116 can be composed of the same material (e.g., SiO2) previously used to cover the first and second sacrificial stacks 110 and 112, or can be a different insulation or oxide material. Following deposition of the oxide material 116, a chemical mechanical planarization (CMP) process is performed which stops on the upper surface of the hardmask 114 as shown in FIG. 5B. As further illustrated in FIGS. 5C and 5D, the CMP process results in the upper surface of the oxide material 116 being flush (i.e., co-planar) with the upper surface of the hardmask 114.

Figure 6B:
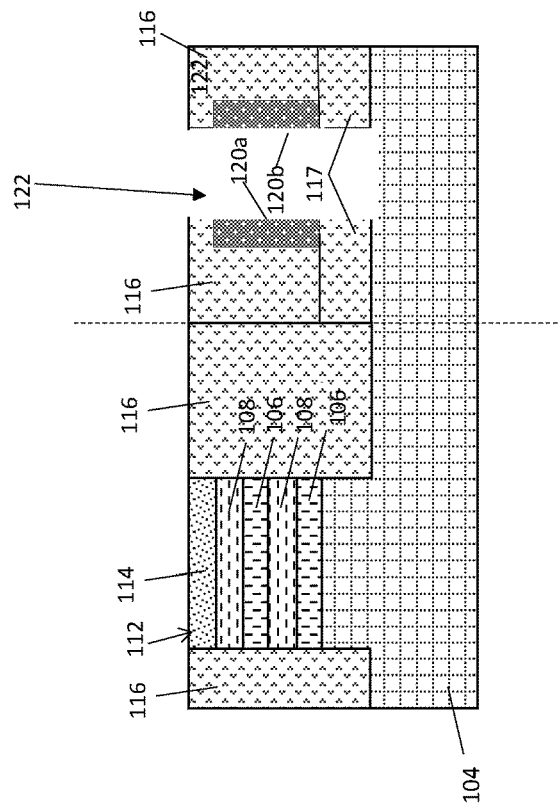
FIG. 6B is a cross-sectional view of the wafer taken along line Y-Y.
Figure 6A:
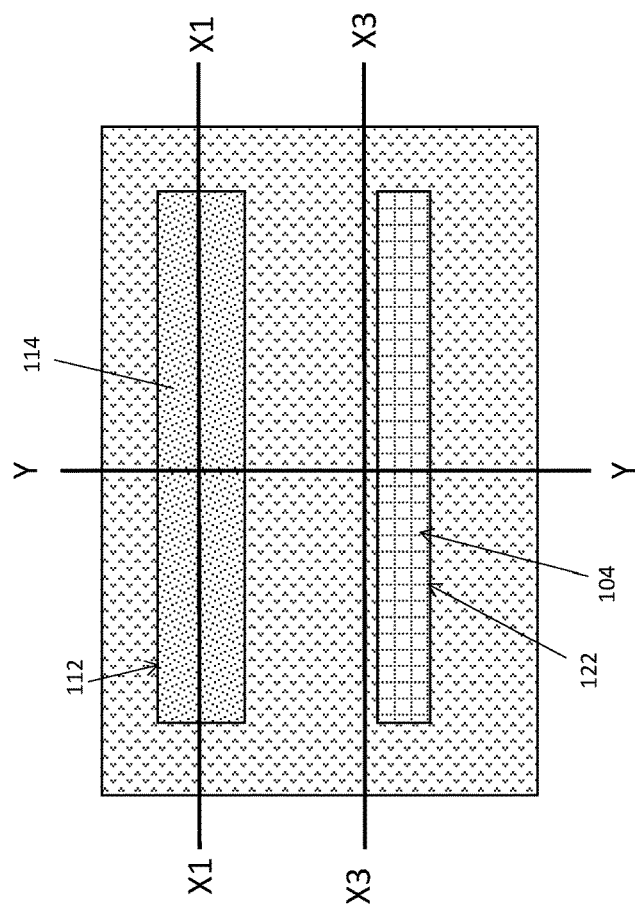
FIG. 6A is a top view of the wafer following removal of the first sacrificial stack to form a void.

With reference now to FIG. 6A, a top view of the wafer 100 is illustrated following removal of the first sacrificial stack 110. As shown in FIG. 6B, removal of the first sacrificial stack 110 forms a void 122 between the inner sidewalls of the first fin 120a and the second fin 120b.

The first sacrificial stack 110 can be removed by first depositing a mask (not shown) on the NFET region 103 to cover second sacrificial stack and hardmask material 114, and then performing a first directional etching process (e.g., dry RIE process) on the exposed hardmask material 114 located in the PFET region 101. Once the hardmask material 114 is removed, a second direction etching process (e.g., a dry RIE process or wet etching process) is performed that completely removes the first sacrificial stack 110 as illustrated in FIG. 6B. Although the first sacrificial stack 110 is removed using a dual etching process as described above, it should be appreciated that a single etching can be used, which through the hardmask material 114 and the attacks the first sacrificial stack 110 in a single step.

Figure 6D:
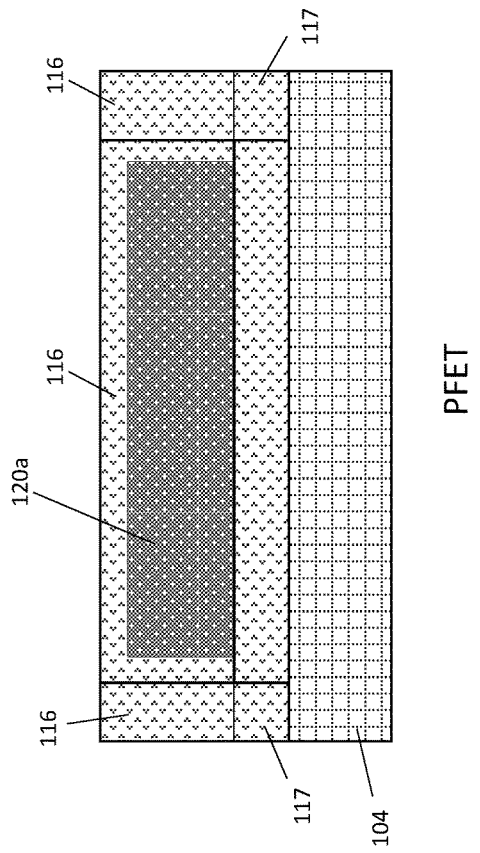
FIG. 6D is a cross-sectional view of the wafer taken along X3-X3.
Figure 6C:
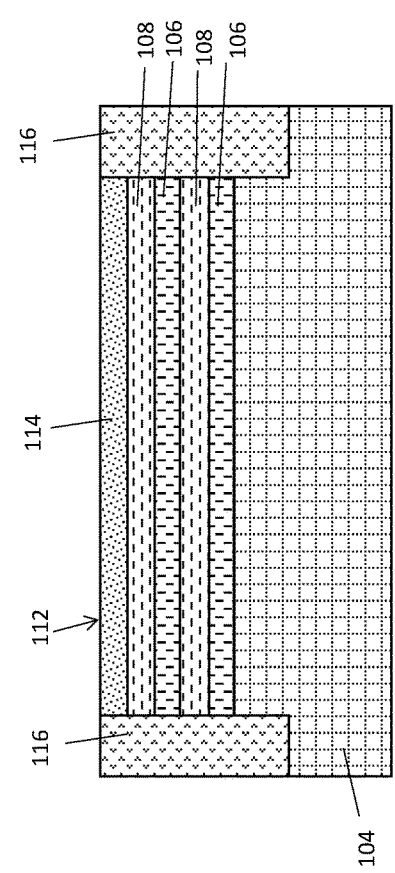
FIG. 6C is a cross-sectional view of the wafer taken along X1-X1.

FIGS. 6C and 6D illustrate the wafer 100 taken along a repositioned cross-sectional line X3-X3. FIG. 6D, for example, illustrates a length-wise view of the fin (e.g., 120a). The oxide material 116 covers the upper surface and base of the fin without covering the fin's inner sidewall.

Figure 7B:
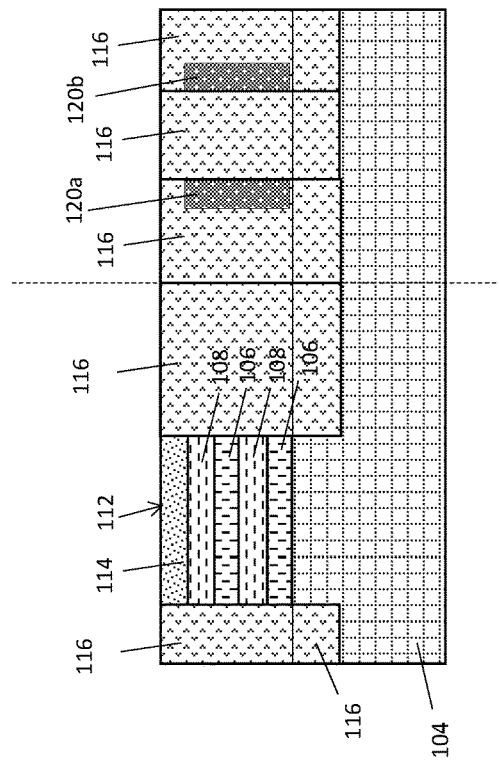
FIG. 7B is a cross-sectional view of the wafer taken along line Y-Y.
Figure 7A:
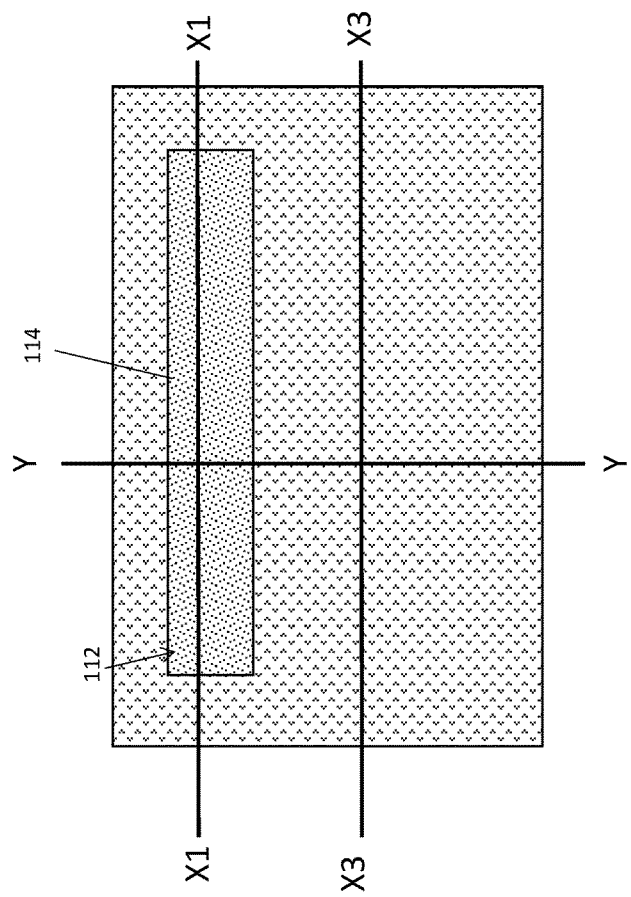
FIG. 7A is top view of the wafer after refilling the void with a dielectric material.

Turning now to FIG. 7A, a top view of the wafer 100 is illustrated following an oxide deposition process that fills the void 122 with an oxide material 116. The oxide material 116 can be composed of the same material (e.g., SiO2) previously used to cover the first and second fins 120a and 120b, or can be a different insulation or oxide material. Following deposition of the oxide material 116, a CMP process is performed to remove any excess oxide material which can overflow from within the previously formed void 118. The CMP process can be performed so that the upper surface of the oxide material 116 filling the void is flush (i.e., co-planar) with the upper surface of the oxide material 116 covering the first and second fins 120a and 120b as further illustrated in FIG. 7B.

Referring to FIG. 8A, a top view of the wafer 100 is illustrated following an etching process that recesses the oxide material 116 in both the PFET region 101 and the NFET region 103. The etching process can be a direction dry RIE process or a wet etching process, and can be timed so that the oxide material 116 is recessed to a desired depth. The time of the etching process can be measured during testing to ensure that the oxide material 116 is not recessed below the first and second fins 120a and 120b, or the second sacrificial stack 112.

FIG. 8B is a cross-sectional view of the wafer 100 taken along line Y-Y, which shows the state of the PFET region 101 and the NFET region 103 following the etching process. In the PFET region 101, the sidewalls and upper surface of the first and second fins are fully exposed. In the NFET region 103, the sidewalls and upper surface of the second sacrificial stack 112 are fully exposed. FIGS. 8C and 8D illustrate a length-wise view of the second sacrificial stack 112 and one of the fins (e.g., 120a), respectively, further showing that their sidewalls and upper surface are fully exposed.

Turning to FIG. 9A, a top view of the wafer 100 is illustrated following formation of a dummy gate stack 124. The dummy gate stack 124 can be formed using conventional patterning techniques. In one or more embodiments, the dummy gate stack 124 can include a nitride cap 126 (SixNyHz) formed on polysilicon (polysi) dummy gate 128 and optional dummy gate oxide (not shown). Other variants of the materials and ordering of the layers are also acceptable as long as the nitride cap 126 has sufficient stopping (i.e., etch or CMP) properties.

Referring to FIG. 9B, the dummy gate 128 wraps around a portion of the upper surface and sidewalls of the first fin 120a, the second fin 120b, and the sacrificial stack 112. The portions of the fins 120a and 120, and the sacrificial stack 112 covered by the dummy gate 128 reserved for forming a channel region of a PFET device and NFET device, respectively, as described in greater detail below. Cross-sectional views of the PFET region 101 and the NFET region 103 are further illustrated in FIGS. 9C and 9D, respectively.

Figure 10B:
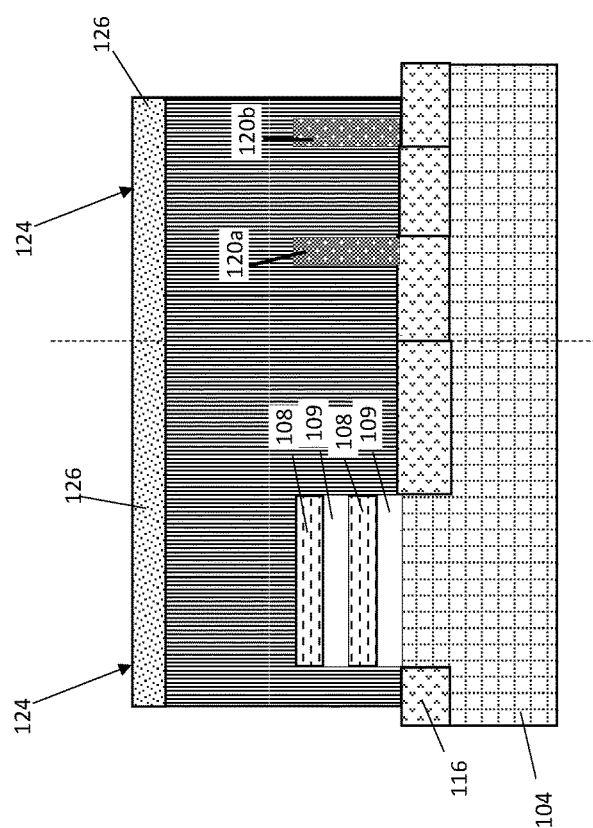
FIG. 10B is a cross-sectional view of the wafer taken along line Y-Y.
Figure 10A:
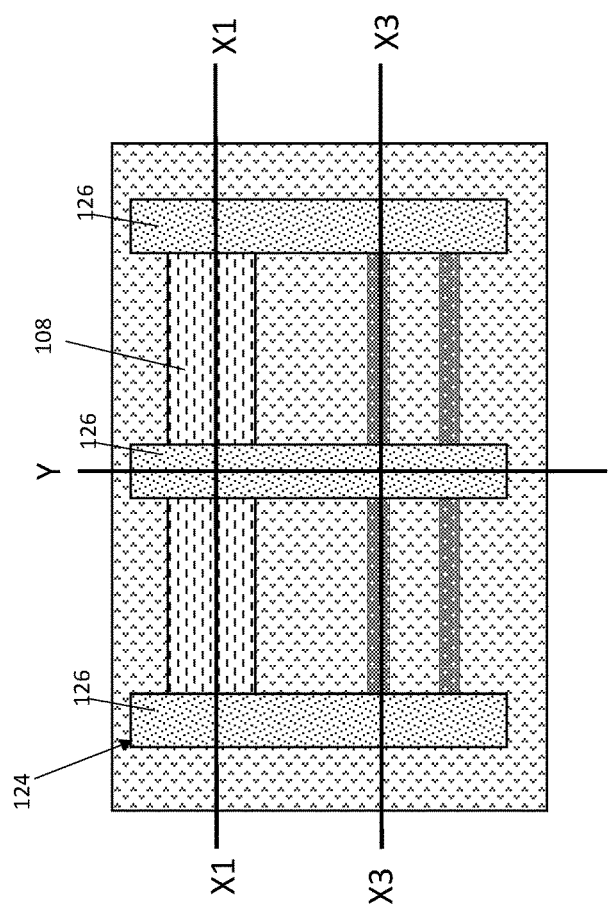
FIG. 10A is a top view of the wafer following removal of the sacrificial layers from the second sacrificial stack.

With reference now to FIG. 10A, a top view of the wafer 100 is illustrated following a selective etching process that removes the sacrificial layers 106 from the second sacrificial stack 112. In other embodiments of the invention, the sacrificial layers 106 can be removed when performing a replacement metal gate (RMG) process, which is described in greater detail below.

FIG. 10B illustrates in greater detail the removal of the sacrificial layers 106, which in turn releases the active semiconductor layers 108. The released semiconductor layers 108 will be referred to going forward as nanosheets 108. The nanosheets 108 can have a length (e.g., extending along the X-axis) ranging, for example, from approximately 50 nm to approximately 1000 nm, a width (e.g., extending along the Y-axis) ranging, for example, from approximately 10 nm to approximately 50 nm, and a height (i.e., vertical thickness extending along the Z-axis) ranging, for example, from approximately 5 nm to approximately 20 nm.

Various etching process that selectively attack the sacrificial material (e.g., SiGe) while preserving the active semiconductor material (e.g., Si) can be used to release the nanosheets 108 and form voids 109 therebetween. In one or more embodiments of the invention, a wet etching process is used to attack the sacrificial SiGe material, without attacking or significantly attacking the active Si material to release the nanosheets 108. Following the etching process, the wafer 100 is provided with one or more nanosheets 108 formed in the NFET region 103 and one or more semiconductor fins 120a and 120b formed in the PFET region 101 as illustrated in FIGS. 10C and 10D, respectively. As further illustrated in FIG. 10C, a portion of the sacrificial material 106 can be maintained between the nanosheets 108 at locations covered by the dummy gate 126.

Referring now to FIGS. 11A and 11B, the wafer 100 is illustrated after forming spacers 130 on sidewalls of the dummy gate stacks 124. The spacers 130 can be composed of various materials such as SiN, for example, and can be deposited using, for example, a chemical vapor deposition (CVD) process. As illustrated in FIG. 11B, a portion of the spacer material can be formed on the inner sidewalls of the remaining sacrificial layers 106 to form tunnel spacers 131. The tunnel spacers 131 serve to reduce the parasitic capacitance of the NFET S/D elements and gate electrodes, which are subsequently formed as described in greater detail below.

Figure 11D:
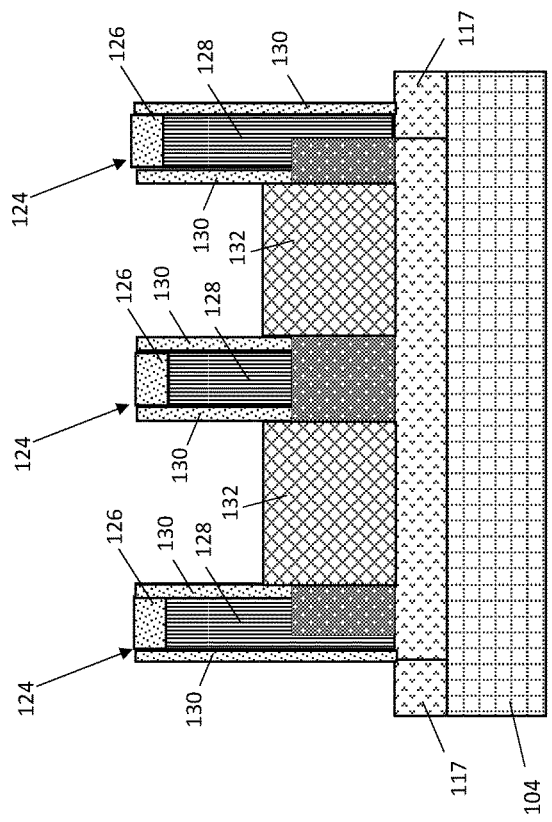
FIG. 11D is a cross-sectional view of the wafer taken along line X3-X3.
Figure 11C:
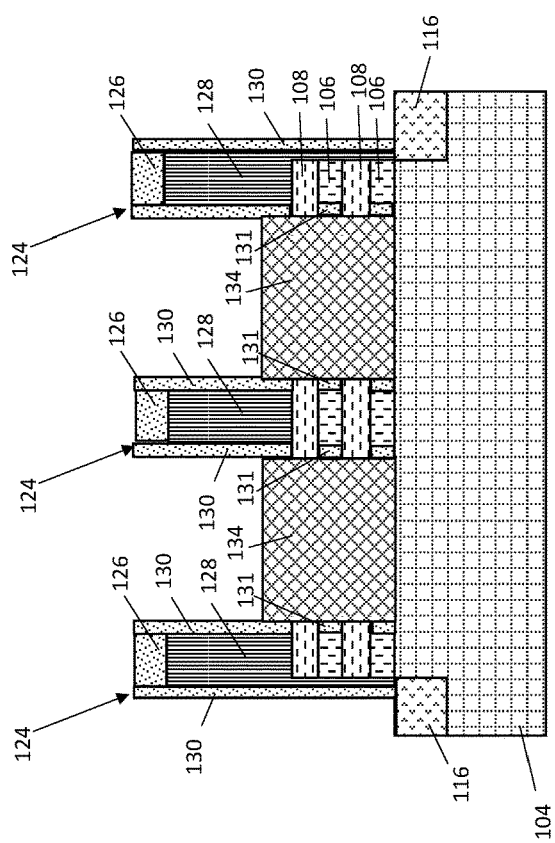
FIG. 11C is a cross-sectional view of the wafer taken along line X1-X1.

As further illustrated in FIGS. 11C and 11D, a first set of source/drain elements 132 (i.e., the PFET S/D elements 132) are formed in the PFET region 101, and a second set of source/drain elements 134 (i.e., the NFET S/D elements 134) are formed in the NFET region 103. The PFET S/D elements 132 and the NFET S/D elements 134 are formed according to an epitaxy process and serve as raised source/drain regions of the corresponding device. The PFET S/D elements 132 can be formed by epitaxial growing a semiconductor material from the sidewalls and upper surface of the fins 120a and 120b. The NFET S/D elements 134 can be formed by epitaxial growing a semiconductor material from the exposed surfaces of the nanosheets 108.

The epitaxy process can be carried out using various well-known techniques including, but not limited to, vapor phase epitaxy (VPE), molecular beam epitaxy (MBE) or liquid phase epitaxy (LPE) with a gaseous or liquid precursor, such as, for example, silicon tetrachloride. The epitaxy process can also include an in-situ doping of the epitaxy material with an impurity such as boron (B), arsenic (As), or phosphorus (P) for example to increase its conductivity. Thereafter, a well-known anneal process (not shown) can be performed to activate the dopants within the epitaxy material.

In one or more embodiments of the invention, the epitaxy process can be continued until the source/drain elements 132 in the PFET region 101 are partially or completely merged, and the source/drain elements 134 in the NFET region 103 are partially or completely merged. Merging together the PFET S/D elements 132 and the NFET S/D elements 134 minimizes the series resistance so as to maintain low parasitic resistance in the PFET region 101 and the NET region 103.

Merging the PFET S/D elements 132 also effectively merges together the first and second fins 120a and 120b, thereby allowing a single contact via (not shown) to establish conductivity between all the fins 120a and 120b, as well as also allowing more flexible placement of the contact via.

Figure 12B:
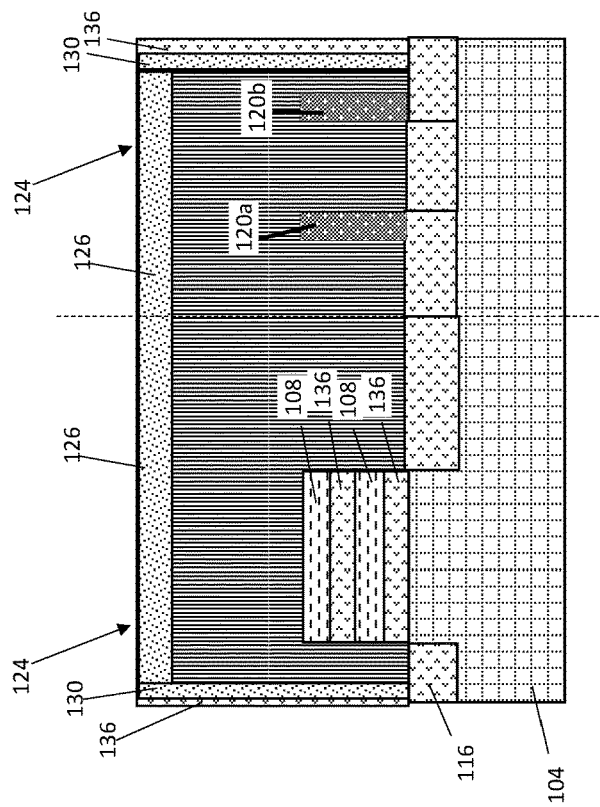
FIG. 12B is a cross-sectional view of the wafer taken along the line Y-Y.
Figure 12A:
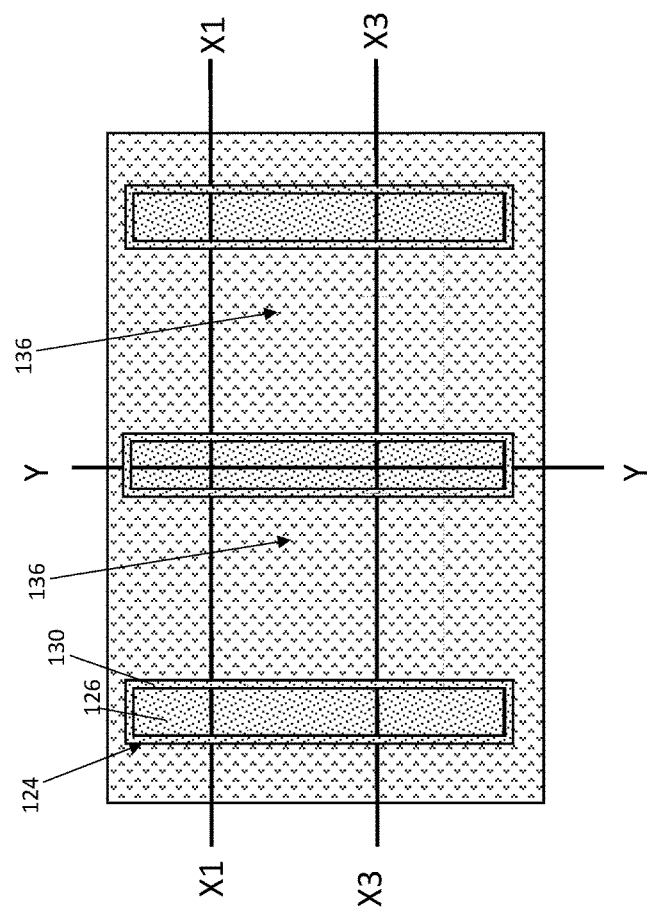
FIG. 12A is a top view of the wafer following formation of gate spacers on a sacrificial gate.

Turning to FIG. 12A, the top of the wafer 100 is illustrated following deposition of an inter-layer dielectric (ILD) 136. The ILD 136 is composed of a flowable oxide material such as polymer hydrogen silsesquioxane (HSQ) solution in methyl isobutyl ketone (MIBK), for example, and can be deposited to completely cover the PFET S/D elements 132 and the NFET S/D elements 134. In one more embodiments of the invention, a subsequent planarization process can be performed. The planarization process can be selective to the ILD 136 so that the etching process stops on the upper surface of the gate cap 126 and spacers 130. In this manner, the upper surface of the ILD 136 can be flush (i.e., co-planar) with respect to the upper surface of the gate cap 126 and the spacers 130 as further illustrated in FIGS. 12C and 12D.

With reference now to FIG. 13A, the top of the wafer 100 is illustrated following an RMG process. The RMG process includes removing of the dummy gate 128 to form a gate trench. In the NFET region 103, the gate trench exposes the nanosheets 108. In one or more embodiments of the invention where the nanosheets 108 were previously released prior to this the RMG process, the gate trench also exposes voids between the nanosheets. In one or more embodiments of the invention, the sacrificial layers 106 are maintained in the second sacrificial stack until performing the RMG process. In this case, the sacrificial layers 106 can be selectively removed to release the nanosheets 108 as described above with reference to FIGS. 10A-10D. The details of the etching process used to selectively remove the sacrificial layers 106 will not be repeated for the sake of brevity. In any case, the dummy gate 128 can be removed (i.e., pulled) using various etching processes such as, an ammonium hydroxide etching process, for example, which is implemented in well-known RMG processes. Because the PFET S/D elements 132 and the NFET S/D elements 134 are covered by the gate spacers 130 and the ILD 136, no additional masking layers are necessary to remove the dummy gate 128.

The RMG process then proceeds by depositing a conformal gate dielectric layer 137, which lines the inner sidewalls of the spacers 130. In addition, gate dielectric layer 137 lines the sidewalls and upper surface of the first and second fins 120a and 120b in the PFET region, while lining the outer surface of the nanosheets 108 in the NFET region 103. The gate dielectric layer 137 is composed of a high-k material such as hafnium oxide (HFO2), for example, which prevents large leakage currents from flowing into the channel when a voltage is applied to the subsequently formed gate electrode, while allowing the applied gate voltage to set up a transverse electric field in the channel region in a controllable manner. The gate trench is then filled with the gate material to form a gate electrode 138, which can be subsequently covered with a nitride gate cap 140 to form a metal gate structure 142. In the PFET region 101, the gate electrode 138 wraps around the sidewalls and upper surface of the first and second fins 120a and 120b (see FIG. 13B). In the NFET region 103, the gate electrode 138 wraps around the exterior surface of the nanosheets 108 (see FIG. 13B).

Although not illustrated, it should be appreciated that the metal gate structure 142 can include one or more work function metal layers including, but not limited to, a titanium nitride (TiN) liner and a tantalum nitride (TaN) liner, which are interposed between the spacers 130 and the gate electrode 138 as understood by one of ordinary skill in the art. Accordingly, it should be appreciated that the metal gate structure 142 can include the metal gate electrode 138, the gate dielectric layer 137, and the work function metals. It should also be appreciated that a chemical-mechanical planarization (CMP) process can be performed after depositing the gate cap material. In this manner, the upper surface of the gate cap 140 is formed flush with the upper surface of the spacers 130 and the upper surface of the ILD 136 as further illustrated in FIGS. 13C and 13D. Although not illustrated, one or more back end of line (BEOL) processes can be performed in the PFET region 101 and NFET regions 103 to form, for example, metal contacts, insulating layers (dielectrics), metal levels, and bonding sites. Accordingly, a CMOS device 200 can be formed including a fin-type PFET 202 and a nanosheet NFET 204 on the same wafer 100. The fin-type PFET 202 has a <110> orientation that optimizes hole mobility through the fins 120a and 120b (i.e., the PFET channels), while the nanosheet NFET 204 has a <100> orientation that optimizes electron mobility through the individual nanosheets 106 (i.e., the NFET channels). In this manner, the entire performance of the CMOS device 200 fabricated from the process flow described herein is optimized compared to conventional CMOS devices.

Figure 14B:
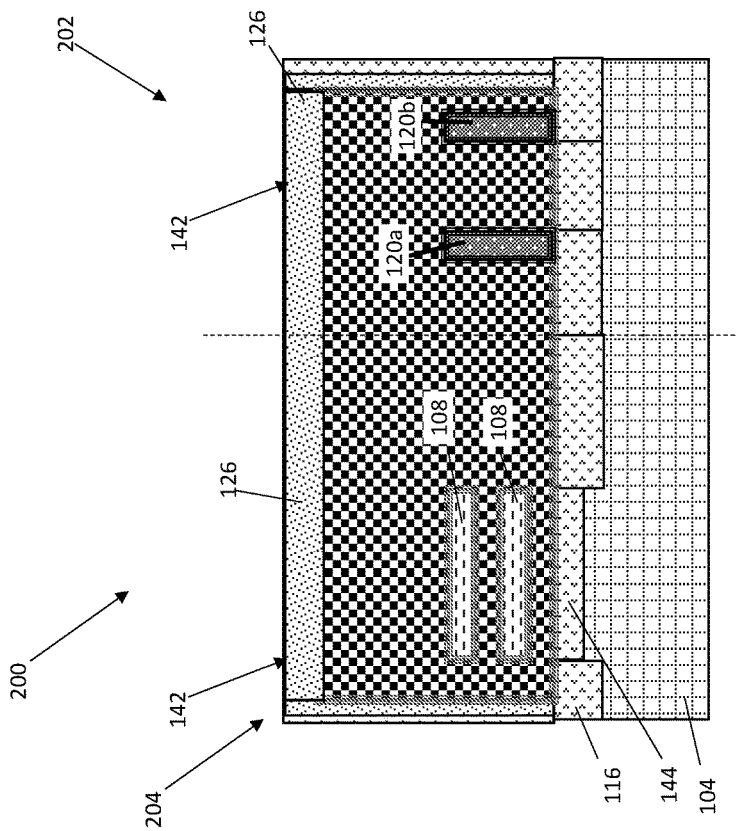
FIG. 14B is a cross-sectional view of the wafer taken along the line Y-Y.
Figure 14A:
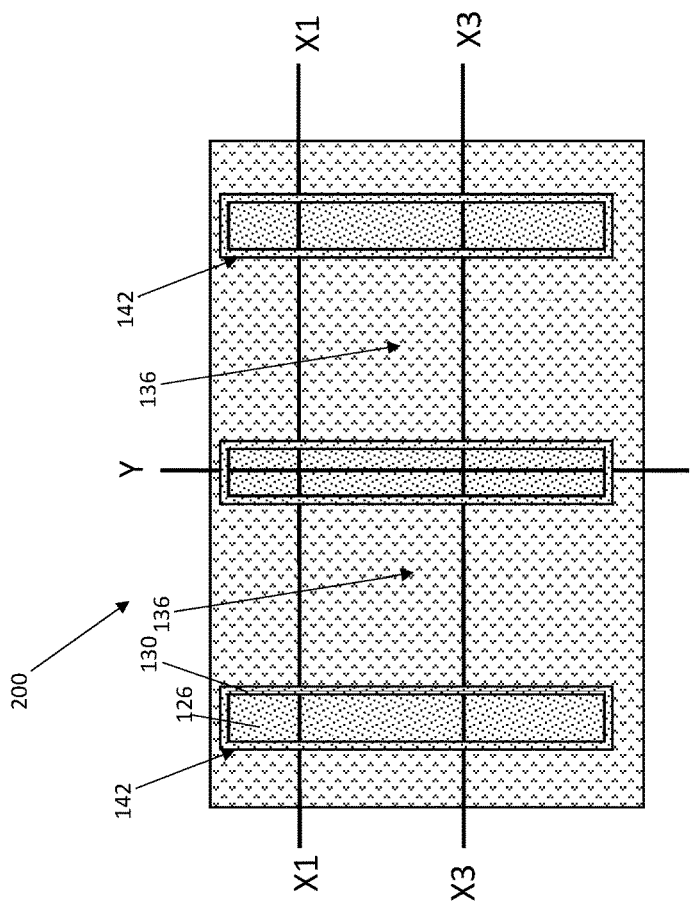
FIG. 14A is a top view of the wafer following formation of an optional bulk insulator layer.
Figure 14D:
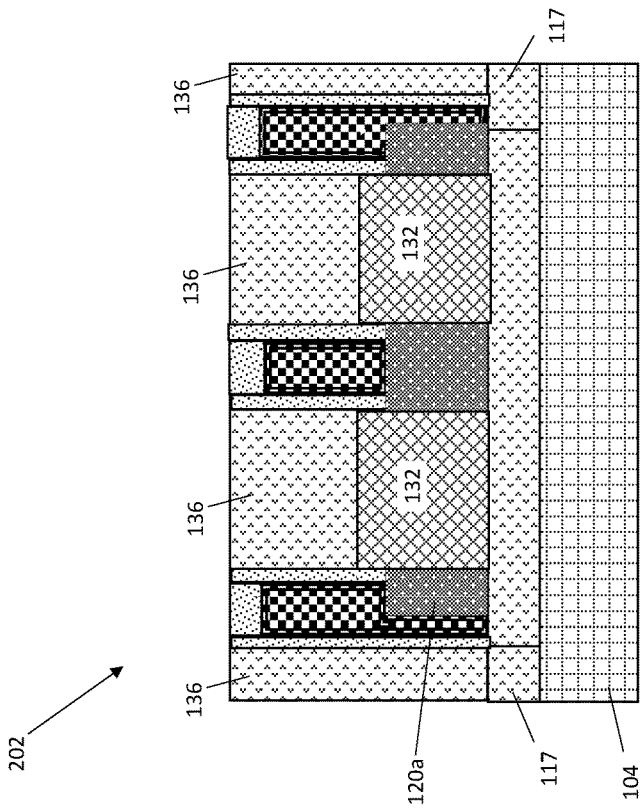
FIG. 14D is a cross-sectional view of the wafer taken along line X3-X3.
Figure 14C:
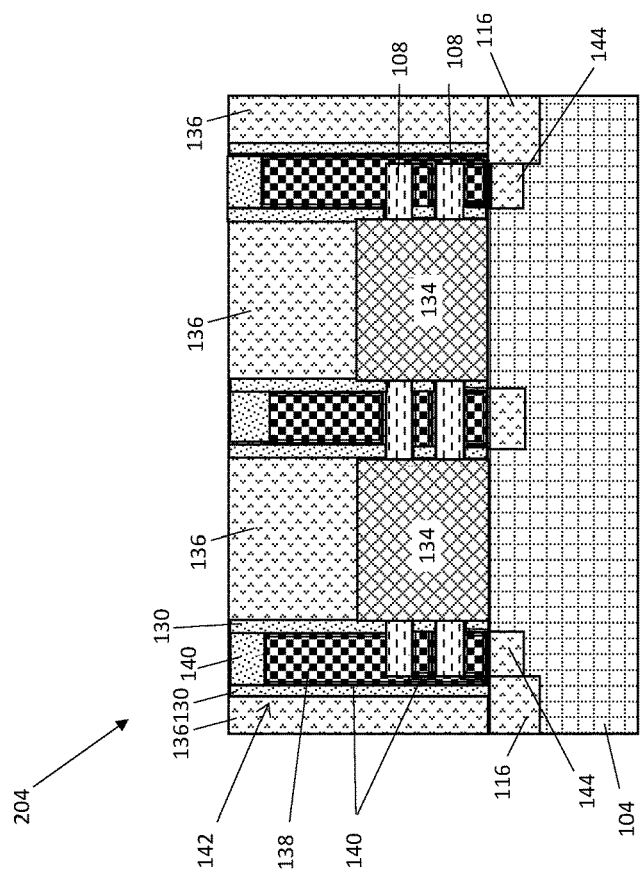
FIG. 14C is a cross-sectional view of the wafer taken along the line X1-X1.

An embodiment including an optional bulk insulator layer 144 is illustrated in FIGS. 14A and 14B. The optional bulk insulator layer 144 can be formed by utilizing a wafer 100 that includes an initial sacrificial layer 106 having a greater concentration of Ge, for example, as described herein. The initial sacrificial layer 106 can then be selectively etched away during the RMG process, and replaced with a dielectric material such as SiO2, for example, to form the bulk insulator layer 144 as illustrated in FIGS. 14A-14D. The bulk insulator layer 144 serves to further reduce the parasitic capacitance in the NFET region 103.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains", "containing, "composed of" or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

As previously noted herein, for the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having a dummy fin removed from within an array of tight pitch fins according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Aspects of the present invention are described herein with reference to flowchart illustrations and/or block diagrams of methods, and apparatus (devices) products according to embodiments of the invention. The flowchart and block diagrams in the Figures illustrate the architecture, functionality, and operation of possible implementations of the device and method of fabricating the device according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

The present invention can be a device and/or method of fabricating the device at any possible technical detail level of integration. The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a configuration of semiconductor devices, the method comprising:
   forming a first sacrificial semiconductor stack on a semiconductor wafer and a second sacrificial semiconductor stack on the semiconductor wafer;
   epitaxially growing a semiconductor material from the first sacrificial semiconductor stack and subsequently removing the first sacrificial semiconductor stack to form a semiconductor fin;
   selectively removing sacrificial layers from the second sacrificial semiconductor stack while maintaining active semiconductor layers of the second sacrificial semiconductor stack to form a semiconductor nanosheet; and
   forming a first gate structure on the semiconductor fin to define a fin-type device on the semiconductor wafer, and forming a second gate structure on the semiconductor nanosheet to define a nanosheet device on the semiconductor wafer.

2. The method of claim 1, wherein the fin-type device is a p-type field effect transistor (PFET), and the nanosheet device is an n-type field effect transistor (NFET).

3. The method of claim 2, wherein the semiconductor fin defines a channel of the PFET having a first channel length, and wherein the semiconductor nanosheet defines a channel of the NFET having a second channel length that is greater than the first channel length.

4. The method of claim 1, wherein forming the first and second sacrificial semiconductor stacks comprises:
   forming, on an upper surface of a bulk semiconductor layer, an alternating series of sacrificial semiconductor layers, and active semiconductor layers stacked on top of one another;
   etching a first portion of the alternating series of sacrificial semiconductor layers and active semiconductor layers while masking a second portion of the alternating series of sacrificial semiconductor layers and active semiconductor layers to form the first sacrificial stack; and
   etching the second portion of the alternating series of sacrificial semiconductor layers and active semiconductor layers while masking the first portion of the alternating series of sacrificial semiconductor layers and active semiconductor layers to form the second sacrificial semiconductor stack.

5. The method of claim 4, wherein forming the first and second gate structures comprises:
   forming a first dummy gate on the semiconductor fin, and replacing the first dummy gate with a first electrically conductive gate electrode; and
   forming a second dummy gate on the semiconductor nanosheet, and replacing the second dummy gate with a second electrically conductive gate electrode.

6. The method of claim 5, wherein forming the second electrically conductive gate electrode further comprises:
   etching the dummy while preserving the active semiconductor layers to form a gate void; and
   depositing an electrically conductive material in the gate void such to form the gate electrode that wraps around all exposed surfaces of the active semiconductor layers.

7. The method of claim 6, wherein the electrically conductive material is a metal material.

8. The method of claim 6, wherein forming the gate structure further comprises:
   forming voids between the active semiconductor layers when selectively removing the sacrificial layers from the second sacrificial semiconductor stack; and depositing a dielectric material on sidewalls of the dummy gate to form gate spacers.

9. The method of claim 8, where forming the gate spacers includes depositing a portion of dielectric material in the voids to define an opposing pair of tunnel spacers in each void.

10. The method of claim 4 wherein the sacrificial layers comprise silicon germanium (SiGe) and the active semiconductor layers comprise silicon (Si).

11. A method of fabricating a configuration of complimentary metal-oxide-semiconductor (CMOS) device, the method comprising:
forming, on an upper surface of a bulk semiconductor layer of a semiconductor wafer, an alternating series of first semiconductor layers and second semiconductor layers stacked on top of one another, a lower-most first semiconductor layer formed directly on the bulk semiconductor layer and having a different doping concentration of than remaining first semiconductor layers;
etching the alternating series of first semiconductor layers and second semiconductor layers to form a first sacrificial stack on the semiconductor wafer and a second sacrificial stack on the semiconductor wafer;
selectively etching the remaining first semiconductor layers with respect to the second semiconductor layers and the lower-most first semiconductor layers layer to form a plurality of semiconductor nanosheets;
epitaxially growing a semiconductor material from the first sacrificial semiconductor stack and subsequently removing the first sacrificial semiconductor stack to form a semiconductor fin;
replacing the lower-most first semiconductor layers layer with a dielectric layer; and
forming a first electrically conductive gate structure on the semiconductor fin to define a p-type field effect field transistor (PFET) on the semiconductor wafer, and forming a second electrically conductive gate structure on the plurality of semiconductor nanosheets to form an n-type filed effect transistor (NFET) on the semiconductor wafer.

12. The method of claim 11, wherein replacing the lower-most first semiconductor layer comprises:

selectively etching the lower-most first semiconductor layers while preserving the semiconductor nanosheets to form a trench; and
filling the trench with the dielectric material to form a channel region dielectric configured to reduce parasitic capacitance.

13. The method of claim 12, wherein the dielectric material comprises silicon dioxide (SiO2).

14. The method of claim 12, wherein the semiconductor fin defines a channel of the PFET having a first channel length, and wherein the semiconductor nanosheet defines a channel of the NFET having a second channel length that is greater than the first channel length.

15. A complimentary metal-oxide-semiconductor (CMOS) device,
the CMOS device comprising:
a wafer including a bulk semiconductor layer;
a fin-type semiconductor device on a first portion of the wafer; and
a nanosheet semiconductor device on a second portion of the wafer different from the first portion,
wherein the fin-type semiconductor device includes a semiconductor fin that defines a channel having a first channel length, and wherein the nanosheet semiconductor device includes a plurality of individual semiconductor nanosheets vertically separated from one another by a void, each semiconductor nanosheet defining a channel of having a second channel length that is greater than the first channel length.

16. The CMOS device of claim 15, wherein the fin-type semiconductor device is a p-type semiconductor device (PFET), and the nanosheet semiconductor device is an n-type semiconductor device (NFET).

17. The CMOS device of claim 16, wherein the NFET includes a plurality of semiconductor nanosheets separated vertically from one another by a void.

18. The CMOS device of claim 17, wherein the NFET further comprises a pair of opposing tunnel spacers formed at opposing ends of each void.

19. The CMOS device of claim 15, wherein the semiconductor fin comprises silicon (Si), and the plurality of semiconductor nanosheets comprise Si.

* * * * *